US010628540B2

(12) United States Patent
Meyer

(10) Patent No.: US 10,628,540 B2
(45) Date of Patent: Apr. 21, 2020

(54) SIMULATION METHOD AND SIMULATION DEVICE

(71) Applicant: dSPACE digital signal processing and control engineering GmbH, Paderborn (DE)

(72) Inventor: Gerrit Meyer, Paderborn (DE)

(73) Assignee: dSPACE digital signal processing and control engineering GmbH, Paderborn (DE)

(*) Notice: Subject to any disclaimer, the term of this patent is extended or adjusted under 35 U.S.C. 154(b) by 488 days.

(21) Appl. No.: 15/408,844

(22) Filed: Jan. 18, 2017

(65) Prior Publication Data
US 2017/0206297 A1    Jul. 20, 2017

(30) Foreign Application Priority Data

Jan. 19, 2016  (DE) .......................... 10 2016 100 771
May 13, 2016  (DE) .......................... 10 2016 108 933
May 30, 2016  (EP) ...................................... 16171914

(51) Int. Cl.
*G05B 17/02*   (2006.01)
*G06F 17/50*   (2006.01)
(Continued)

(52) U.S. Cl.
CPC ......... *G06F 17/5036* (2013.01); *G05B 17/02* (2013.01); *H03K 4/06* (2013.01); *H03K 4/08* (2013.01); *G05B 2219/23446* (2013.01)

(58) Field of Classification Search
CPC ................ G06F 17/5036; G05B 17/02; G05B 2219/23446; H03K 4/06; H03K 4/08
(Continued)

(56) References Cited

U.S. PATENT DOCUMENTS 5,038,247 A * 8/1991 Kelley ................. H01H 47/325
                                                  361/152
8,108,191 B1 * 1/2012 Britch ................. G06F 17/5009
                                                  703/13
(Continued)

FOREIGN PATENT DOCUMENTS

DE    10 2005 048 464 A1    4/2007
DE    10 2008 034 109 A1    2/2010
(Continued)

OTHER PUBLICATIONS

Extended European Search Report for European Application No. 16171912.5 dated Jun. 19, 2017 with English translation.
(Continued)

*Primary Examiner* — Juan C Ochoa
(74) *Attorney, Agent, or Firm* — Muncy, Geissler, Olds & Lowe, P.C.

(57) ABSTRACT

A method for simulating a peripheral circuit arrangement that can be connected to a control device is provided. A simulation device is electrically connected to the control device and has a first control element with which a first simulation current that can be passed from a first load terminal of the control device to a first control element output of the first control element can be influenced. The first control element includes a first multistage converter, and the simulation device also includes a first semiconductor switch control and a computing unit that executes model code. A first switch control signal is computed and provided for forwarding to the first semiconductor switch control, which has at least one first comparator. A pulse-width-modulated first gate-source voltage is generated and applied to a first control terminal and a first simulation current is influenced by the first gate-source voltage.

15 Claims, 11 Drawing Sheets

(51) Int. Cl.
*H03K 4/06* (2006.01)
*H03K 4/08* (2006.01)

(58) Field of Classification Search
USPC .................................................. 703/14, 13
See application file for complete search history.

(56) References Cited

U.S. PATENT DOCUMENTS

| | | | |
|---|---|---|---|
| 8,488,345 B2* | 7/2013 | Tallam | H02M 7/53875 |
| | | | 363/37 |
| 8,754,663 B2 | 6/2014 | Schulte et al. | |
| 8,768,675 B2 | 7/2014 | Bracker et al. | |
| 9,020,798 B2 | 4/2015 | Haupt et al. | |
| 9,576,086 B2* | 2/2017 | Chiang | G06F 17/5009 |
| 2010/0039120 A1 | 2/2010 | Plude et al. | |
| 2011/0133763 A1 | 6/2011 | Schulte et al. | |
| 2012/0105072 A1 | 5/2012 | Peterson | |
| 2012/0150503 A1 | 6/2012 | Haupt et al. | |
| 2014/0268967 A1 | 9/2014 | White et al. | |
| 2016/0036326 A1* | 2/2016 | Sreenivas | H02M 3/158 |
| | | | 323/271 |
| 2017/0227937 A1* | 8/2017 | Batliner | G05B 13/04 |

FOREIGN PATENT DOCUMENTS

| | | |
|---|---|---|
| DE | 10 2014 105 501 A1 | 10/2015 |
| WO | WO 2007/042228 A1 | 4/2007 |
| WO | WO 2010/010022 A1 | 1/2010 |
| WO | WO 2015/165848 A1 | 11/2015 |

OTHER PUBLICATIONS

Extended European Search Report for European Application No. 16171914.1 dated Jun. 13, 2017 with English translation.
German Search Report for German Application No. 102016100771.4 dated Sep. 29, 2016 with English translation.
German Search Report for German Application No. 102016108933.8 dated Jan. 27, 2017 with English translation.
Rodriguez et al., "Multilevel Inverters: A Survey of Topologies, Controls, and Applications," IEEE Trans. on Ind. Elec., vol. 49, No. 4, pp. 724-738 (Aug. 2002).
Kokate et al., "Comparison of Simulation Results Three Level and Five Level H-bridge Inverter and hardware implementation of Single Leg H-Bridge Three Level Inverter," Int'l J. of Innovative Res. Studies, vol. 2.4, pp. 389-402 (2013).

* cited by examiner

SIMULATION METHOD AND SIMULATION DEVICE

This nonprovisional application claims priority under 35 U.S.C. § 119(a) to German Patent Application No. 10 2016 100 771.4, which was filed in Germany on Jan. 19, 2016, German Patent Application No. 10 2016 108 933.8, which was filed in Germany on May 13, 2016, and European Patent Application No. 16171914.1, which was filed in Europe on May 30, 2016, and which are herein incorporated by reference.

BACKGROUND OF THE INVENTION

Field of the Invention

The invention relates to a method for simulating a peripheral circuit arrangement that can be connected to a control device and a simulation device for simulating a peripheral circuit arrangement that can be connected to a control device.

Description of the Background Art

A circuit for emulating—which is to say for simulating—an electrical load at a terminal of a test circuit is known from the WO 2010 010022 A1, which corresponds to U.S. Pat. No. 8,754,663, and which is incorporated herein by reference. Some elements of FIG. 3 of the aforementioned PCT document are appended to the present document as FIG. 1c for better understanding of the prior art. Said document proposes, in particular, a controllable voltage source as a four-quadrant switching device 17 with an internal voltage source 18. A current flowing from the four-quadrant switching device 17 to the test circuit 3 can be coupled in, more particularly via inductance 14 of a bridge shunt arm.

Depending on the requirements for the dynamics of the circuit for simulation, and depending on the nature of the requirements for avoiding or at least reducing an unwanted superposition of ripple currents on the current in the bridge shunt arm or superposition of an unwanted—possibly high-frequency—AC current on the current in the bridge shunt arm, conventional controllable voltage sources could prove to be inadequate for highly precise simulation applications.

It is a part of general technical knowledge that a multi-phase, in particular three-phase, electrical load, for example an electric motor 110 from FIG. 1a, implemented here as a three-phase electric motor, can be connected to a supply circuit, wherein one associated half-bridge circuit for each phase, for instance, can be connected to the relevant phase for current control. FIG. 1a shows an example from the prior art, in which the three phases 101, 102, 103 of an electric motor 110 are supplied by means of a first half-bridge 104, 105, a second half-bridge 106, 107, and a third half-bridge 108, 109, wherein these three half-bridges are composed of field-effect transistors 104, 105, 106, 107, 108, 109, abbreviated as FETs. The drain terminals of the FETs 104, 106, 108 are connected to a common operating voltage 111. The source terminals of the FETs 105, 107, 109 are connected to a common reference voltage GND. The three half-bridges from FIG. 1a can be integrated into a control device that drives the electric motor 110.

FIG. 1b differs from FIG. 1a in that the electric motor 110 is replaced by an electric motor simulation device 120. It is an approach generally known from the prior art to replace a peripheral circuit arrangement, for example the electric motor 110 from FIG. 1a, with a simulation device, for example an electric motor simulation device 120 from FIG. 1b, for test purposes. A problem frequently encountered with prior art electric motor simulation devices is that they either do not adequately emulate reality, or the prior art electric motor simulation devices cannot be retrofitted with sufficient flexibility to changed electric motors that are to be simulated, or else such retrofits require very extensive hardware changes that are time-consuming.

An appropriate test environment, for example, a simulation device, is frequently used for testing of a control unit or a control device that is to be connected to a peripheral circuit arrangement, for example an electrical load, perhaps an electric motor, in an intended later application.

It is known that an expert active in the technical field mentioned at the outset who wishes to provide a simulation device for simulating a peripheral circuit arrangement that can be connected to a control device oftentimes makes use of a simulation device that includes a computing unit on which executable model code is installed. The model code is based on a mathematical model of the peripheral circuit arrangement. The mathematical model is transformed into model code that can be executed on a computing unit, for instance in a method comprising multiple steps, for example including programming, so-called code generation, and a translation step.

By means of cyclic execution, which is to say a cyclic processing, of the model code, predefined output variables are cyclically computed as a function of input variables; these output variables can be used or processed further, for example, to provide voltages and/or currents for simulation purposes.

Testing with the use of a simulation device can in particular offer the advantage that the control unit or the control device can be functionally tested without the need for the control unit or the control device to be placed in its "actual" operating environment. In the above-described context, the control device under test, often referred to as the "control unit" under test, is frequently referred to as the "device under test," abbreviated as "DUT." Frequently, the control device or DUT is connected electrically to a suitably configured simulation device in order to test whether the control device responds in the desired manner, which is to say whether the control device responds to specific state variables received through its interfaces with an appropriate output of output variables that are output through its interfaces. The relevant environment of a control device is fully or partially simulated for this purpose.

In generally recognized test scenarios, the environment to be emulated of the control device under test also includes power electronic components, in particular. For example, testing of a control device may make it necessary to provide an emulation, which is to say a simulation, of an electric motor or another electrical load, which also includes, in particular, an inductance simulation. In general, environments of this type can be simulated in software as well as by means of hardware. Frequently, a simulation device, specially designed hardware, and specially adapted simulation software are employed for testing of a control device with power electronic outputs and/or inputs.

Remaining with this example of a simulated electrical load, a distinctive feature of the simulation of an inductive load resides, in particular, in that it is necessary to take into account in the simulation that a change in the magnetic flux density passing through the corresponding actual inductive load, such as can be caused by a switching operation in the control device, results in an induced voltage. The accompanying nonlinear current and voltage curves should be emulated as realistically as possible in the simulation of the electrical load. In other words, the simulation device used in the test phase of the control device should reflect as closely as possible the behavior of an "actual" inductive load that occurs in the later phase of actual practice.

The simulation devices heretofore available, in particular the simulation devices suitable for so-called "hardware-in-the-loop simulation," abbreviated "HIL simulation," are lacking in adequate scalability and adequate adaptability, which is to say that the scaling and adapting of previous simulation devices, for the purpose of, e.g., adaptation of the simulation device to different inductive loads to be simulated, requires extensive hardware changes in many cases. Frequently, it has only been possible heretofore to solve the problems resulting from the described inadequate scalability and inadequate adaptability through rebuilding or retrofitting work on the simulation device, especially when the electrotechnical parameters of the inductive loads to be successively simulated differ greatly from one another.

There is a need in the industry and in research and development, especially in product development and quality assurance, for an improved method for simulation and an improved simulation device for simulating a peripheral circuit arrangement, for example for simulating an inductive load.

The simulation of the dynamic behavior of the inductive load by means of model code is often subject to requirements such that the model variables that belong to the model code and are to be computed cyclically must, for example, be computable in execution times in the range of a few milliseconds or even only a few microseconds. In this context, an execution time means the period of time that a computing unit requires in order to process a simulation model code once. In other words, the model code is cyclically executed during a simulation, wherein preferably each processing of the model code takes place within a predefined execution time, and the processing of the model code is essentially repeated for as long as the simulation runs. A model-based simulation such as takes place on the said simulation device presupposes a cyclic—which is to say a repeatedly executable—processing of the model code on the computing unit of the simulation device. Generally speaking, a use of computer-assisted simulation models and a use of associated executable model codes is known, with which the aforementioned execution times for cyclic model code processing can be ensured, namely simulation models, for example, that can be created by means of a numerical development and simulation environment. One example of a development and simulation environment including a graphical programming environment is the software product SIMULINK from the firm The MathWorks. One example of the generation of executable model code, for example by means of the software product SIMULINK, is mentioned in the U.S. Pat. No. 9,020,798 B2, which is incorporated herein by reference.

However, in practice it frequently is not sufficient to merely provide the model variables for describing the dynamically changing state of the inductive load within the predefined execution time by means of the model code; rather, it may be necessary, for example, to carry out the simulation of the peripheral circuit arrangement, for example the simulation of the inductive load, in such a manner that particularly voltages and/or currents are provided at the electrical connection points between the simulation device and the control device(s) that have a high degree of agreement with the dynamically changing voltages and/or currents in an "actual", which is to say not simulated, peripheral circuit arrangement. The non-simulated peripheral circuit arrangement includes an inductive load, for example.

In other words, it is a requirement to provide a user with a method for simulation and a simulation device that are equipped to provide, at the designated electrical terminals of the simulation device, appropriate currents and/or voltages for the control device that in each case exhibit only predefined maximum permissible deviations from the corresponding currents and/or voltages of a later application of the control device.

SUMMARY OF THE INVENTION

It is therefore an object of the invention to provide a method for simulating a peripheral circuit arrangement that can be connected to a control device and to provide a simulation device, which advance the state of the art. The stated problems or disadvantages of the prior art should preferably be at least partially avoided or reduced.

According to an exemplary embodiment of the invention, a method for simulating a peripheral circuit arrangement that can be connected to a control device is proposed, wherein a simulation device is electrically connected or can be electrically connected to the control device, and wherein the simulation device has a first control element with which a first simulation current that can be passed from a first load terminal of the control device to a first control element output of the first control element can be influenced, and wherein the first control element includes a first multistage converter having at least a first semiconductor switch with a first control terminal, a second semiconductor switch with a second control terminal, a third semiconductor switch with a third control terminal, and a fourth semiconductor switch with a fourth control terminal, and wherein the simulation device also includes a first semiconductor switch control and a computing unit, and the computing unit executes model code, wherein, by means of the computing unit and the model code, a first switch control signal is computed and provided for forwarding to the first semiconductor switch control, and wherein the first semiconductor switch control has at least one first comparator, and the first comparator includes a first comparator input and a second comparator input and a first comparator output, and wherein a first modulation signal is derived from the first switch control signal and is applied to the first comparator input, and a first carrier signal of a first carrier signal generator is applied to the second comparator input, and a comparison of the first modulation signal with the first carrier signal is carried out by means of the first comparator, wherein during the course of the comparison a pulse-width-modulated first gate-source voltage is generated at the first comparator output and applied to the first control terminal, and the first simulation current is influenced by means of the first gate-source voltage.

Also proposed in accordance with the invention is a simulation device for simulating a peripheral circuit arrangement that can be connected to a control device, wherein the simulation device is electrically connected or can be electrically connected to the control device, and wherein the simulation device has a first control element with which a first simulation current that can be passed from a first load terminal of the control device to a first control element output of the first control element can be influenced, and wherein the first control element includes a first multistage converter having at least a first semiconductor switch with a first control terminal, a second semiconductor switch with a second control terminal, a third semiconductor switch with a third control terminal, and a fourth semiconductor switch with a fourth control terminal, wherein the simulation device also includes a first semiconductor switch control and a computing unit, and the computing unit is provided and equipped for execution of model code, wherein provision is made that, by means of the computing unit and the model code, a first switch control signal is computed and provided for forwarding to the first semiconductor switch control, and wherein the first semiconductor switch control has at least one first comparator, and the first comparator includes a first comparator input and a second comparator input and a first comparator output, and the first comparator output is equipped to have applied to it a first modulation signal derived from the first switch control signal, and the second comparator input is equipped to have applied to it a first carrier signal of a first carrier signal generator, and a comparison of the first modulation signal with the first carrier signal can be carried out by means of the first comparator, wherein during the course of the comparison a pulse-width-modulated first gate-source voltage can be generated at the first comparator output, and wherein provision is made that the first gate-source voltage is applied to the first control terminal, and the first simulation current can be influenced by means of the first gate-source voltage.

It should be noted that a peripheral circuit arrangement can be understood within the scope of the invention to mean any desired electrical load that can be attached to a control device, for example an electric motor or other electromechanical actuator.

One of the advantages of the invention, namely an improved, which is to say more realistic simulation, frequently becomes evident in applications where the peripheral circuit arrangement to be simulated is not "only" an ohmic resistance, because the simulation device according to the invention primarily serves the purpose of providing nonlinear current and voltage curves with changing current directions, for example in order to thus simulate a current from a control device to an "actual" motor winding or another complex peripheral circuit arrangement—but one that is not connected to the control device during the simulation. The more realistic the simulation of the electrical behavior of the peripheral circuit arrangement is, the more meaningful the test results are that are produced in an interaction of the simulation device with the connected control device being tested. Illustrated using the example of the first simulation current, this means that the more the first simulation current matches a current in the subsequent "actual" operating mode that flows from the control device to the "actual" peripheral circuit arrangement, which is to say to the "actual" motor winding, for example, the better the controller characteristics of the control device can be tested, and consequently optimized after the test or between multiple tests.

The model code can be a computer program that is executable on the computing unit, wherein it is essentially immaterial whether the model code is first translated in the course of execution, for example by means of an interpreter, or whether the model code is already present in a format that is executable by the computing unit without further translation. The computing unit preferably includes a computing unit microprocessor or a computing unit microcontroller or an IP core, integrated on an FPGA, for example. One of the tasks of the computing unit associated with the simulation device includes the generation of the first switch control signal by means of the executable model code, something that is discussed in greater detail below.

The first load terminal of the control device is an electrical interface that is implemented by the control device. An electrical load that is connected to the first load terminal is supplied with a current through the first load terminal, wherein this current flows either in the direction of the control device or in the direction of the load connected to the control device, depending on what time-varying electrical potential gradient has arisen between the first load terminal and the first control element output of the simulation device. The first simulation current is the electric current that flows either from the first load terminal of the control device to the first control element output of the simulation device or from the first control element output of the simulation device to the first load terminal of the control device.

The electrical load, also referred to herein as a peripheral circuit arrangement, can be replaced for test purposes by a simulated peripheral circuit arrangement, namely the simulation device.

The first control element includes a first multistage converter, which has at least a first, a second, a third, a fourth semiconductor switch for influencing the first simulation current. It is preferred that, during a running simulation, a corresponding signal originating from the first semiconductor switch control is applied to each of the last-mentioned four semiconductor switches via the control terminal of the applicable semiconductor switch, which process is discussed in greater detail below. The first multistage converter has a first converter output through which at least a part of the first simulation current flows.

The first control element output according to the present teaching is an interface of the simulation device, wherein this interface represents a connection established via the first inductive component to the first converter output of the first multistage converter. The first output voltage of the first control element, which is influenced by the model code executed on the computing unit, is present at the first control element output. When a connection is established from the first control element output to the first load terminal of the control device, a simulation current influenced by the model code flows through this connection in a direction influenced by the model code.

The at least four semiconductor switches of the first control element are each placed in a conductive or a non-conductive state by way of a corresponding first modified switch control signal of the first semiconductor switch control, wherein a specially designed time behavior of the conductive and non-conductive states is brought about for each of the four semiconductor switches of the first control element. In other words, the time behaviors of the switching states of the four semiconductor switches of the first control element are different.

The first multistage converter provided in accordance with the invention, which is a component of the first control element, has semiconductor switches, wherein the semiconductor switches preferably are implemented as field-effect transistors, often abbreviated as "FETs," for example so-called power field-effect transistors, or as so-called silicon carbide JFET components, abbreviated as SiC-JFETs, or as bipolar transistors, or as so-called IGBT components, i.e., bipolar transistors with insulated gate electrodes (IGBT is derived from the term "insulated-gate bipolar transistor").

The first multistage converter preferably is equipped to provide an output voltage at its first converter output whose maximum value is less than or equal to the value of a third supply voltage, and whose minimum value is greater than or equal to the value of a first supply voltage, and the output voltage additionally can assume a value that corresponds to a second supply voltage, where the following quantity relations apply: the third supply voltage is greater than the second supply voltage, and the second supply voltage is greater than the first supply voltage. The first supply voltage, the second supply voltage, and the third supply voltage provide power to the first control element and thus to the first multistage converter.

Because the first multistage converter of the first control element includes at least four semiconductor switches, provision is made that a voltage that is between the third supply voltage and the first supply voltage can be established at the first converter output through timed control of the four semiconductor switches of the first control element. For the purposes of providing a required voltage at the first converter output, at least one first modified switch control signal that is based on the calculation using the model code must be applied to the control terminals of the first control element during a running simulation of the peripheral circuit arrangement.

During a running simulation of the peripheral circuit arrangement, it is preferred for the first modified switch control signal to be electrically applied to four control terminals of the first control element. The first modified switch control signal preferably includes four gate-source voltages, which preferably have different voltage values. In other words, it is preferred that each gate-source voltage of the four gate-source voltages is electrically applied to one of the preferably four control terminals of the first control element.

In an embodiment of the simulation device, provision is made that additional predefined data originating from the control device are made available by the control device to the computing unit of the simulation device in parallel with the cyclic execution of the model code, and these data are provided in order to be taken into account in the cyclic execution of the model code. In other words, the last-mentioned embodiment of the simulation device is equipped to use data from the control device as input variables in the calculations of the model code. A suitable interface of the control device for providing data originating from the control device for the purpose of forwarding it to the computing unit of the simulation device is, on the control device side, a so-called debug interface, for example a standardized JTAG or Nexus interface.

Another embodiment of the simulation device according to the invention has, in addition to the first control element, a second control element and a third control element.

In the last-mentioned improvement of the invention, provision is made that the second control element is implemented as a second multistage converter and/or the third control element is implemented as a third multistage converter. The phrase "additional multistage converters" in the text below conceptually combines at least the second multistage converter and the third multistage converter, but this is not intended to convey, however, that a simulation device that has two or four or more than four multistage converters cannot be a useful improvement of the invention. The additional multistage converters preferably are connected to the first supply voltage, to the second supply voltage, and to the third supply voltage.

In addition, it is preferred that the additional multistage converters, for example the second multistage converter of the second control element and the third multistage converter of the third control element, have a hardware structure that is essentially the same as or that is identical to that of the first multistage converter of the first control element.

It is proposed within the scope of the present teaching to preferably implement the first multistage converter and/or the additional multistage converters as three-stage converters in each case. A three-stage converter is distinguished by the fact that three different input potentials or input voltages are present at the three-stage converter in ongoing operation, wherein, through appropriate driving of the semiconductor switches of the three-stage converter, an output voltage can be established that in principle—if line and transmission losses are disregarded—extends from the smallest input voltage through the medium input voltage to the largest input voltage of the applicable three-stage converter. The three-stage converter, which represents a preferred embodiment of the multistage converter, is discussed again below within the framework of the figure description. Generally speaking, it is possible not only to implement the first and/or the additional multistage converters as three-stage converters, which is to say with three different supply voltages, but it is alternatively also possible for the multistage converter or converters to be implemented as four-stage converters or as N-stage converters, which is to say with four or N different supply voltages, for example with N=4, N=5, N=6, or N>6.

The inductive component provided in accordance with an improvement of the simulation device is preferably implemented as an electrical coil. It is optionally possible to provide for the electrical coil to be equipped with a ferrite core or an iron core. In addition, a means for changing the inductance value of the inductive component can be provided in that the means brings about, e.g., a displacement of a ferrite or iron core interacting with the coil.

It should be noted that an inductive reactance of the inductive component can have a non-negligible limiting effect on the first simulation current during a transition of one of the four semiconductor switches of the first multistage converter, for example, wherein preferably the model code and/or a control apparatus of the simulation device is designed to take into account and/or to compensate for the limiting effect. The fact that a limiting or increase of the simulation current during a running simulation is not of necessity caused solely by the simulation device is further clarified using the following figures and the figure description. The simulation device is therefore preferably equipped to take into account a potential gradient between one voltage at the first converter output and another voltage at the first control element output, in particular, which is achieved in an improvement of the invention through processing of the information concerning the first output voltage of the first control element during cyclic processing of the model code by the computing unit.

According to the present invention the simulation device includes, among other things, a computing unit for execution of model code. Fundamentally, any desired computer can be used as the computing unit as long as it is ensured that the computer has at least a minimum computing power matched to the relevant application, and suitable equipment, for example adequate working memory, wherein the computing power and the equipment of the computing unit must also suffice to ensure cyclic execution of the model code within a predefined cycle time. Preferably, the computing unit is real-time capable, wherein it is preferred in particular for the computing unit to be equipped with a so-called real-time operating system. It is especially preferred for both the real-time operating system and the model code to be implemented such that all necessary criteria of what is known as "hard real-time" are met during execution of the model code by the computing unit. In the context described, hard real-time means that, for example, the cyclic execution of the model code is guaranteed to take place within a predefined time interval, namely a predefined maximum cycle time. In the last-mentioned embodiment of the computing unit, which is hard real-time-capable, exceeding the predefined maximum cycle time, if the exceedance were to occur once, results in a system fault of the computing unit, which causes, e.g., an abnormal termination or a restart of the simulation.

It should be noted that the computing unit has an output for outputting the first switch control signal and optionally for outputting a second and/or third switch control signal.

The first switch control signal is provided by the computing unit for forwarding to a first semiconductor switch control during ongoing operation of the simulation device. The first semiconductor switch control is provided and equipped to convert the first switch control signal into at least a first modified switch control signal.

During ongoing operation of the simulation device, the first switch control signal is converted into at least a first modified switch control signal, which is to say that a signal conversion takes place within the first semiconductor switch control from the initially abstract first switch control signal to the first modified switch control signal that is intended for direct transmission to the control terminals of the semiconductor switches of the first control element.

Even though the first switch control signal already contains information about a desired switch state of at least one semiconductor switch of the first control element, the first switch control signal is not intended to be applied directly to one or more control terminals of the semiconductor switches of the first control element, because the first switch control signal is first converted into a first modified switch control signal having appropriately matched signal levels for control of the semiconductor switches of the first control element. In other words, this means that the information provided by the executed model code about a state of the first control element that is to be established is contained in the first switch control signal. The first semiconductor switch control is provided and equipped to convert the first switch control signal into a first modified switch control signal. Preferably, the modified switch control signal is applied directly to the control terminals of the first control element in order to achieve the switch state to be established in the first control element that is computed by the model code in each computation cycle. The first modified switch control signal is matched to the technical parameters of the semiconductor switches to be controlled, for example to their semiconductor switch gate-source voltage interval that is permissible or specified by a semiconductor switch manufacturer, wherein the example of the matched gate-source voltage interval applies in particular to those semiconductor switches that are implemented as field-effect transistors.

For the purpose of easier understanding of the present teaching, field-effect transistors are frequently cited hereinafter as embodiments of the semiconductor switches of the first control element and/or of the second control element and/or of the third control element, although as a general rule other embodiments of semiconductor switches, for example the "IGBT components" already mentioned, can also be used. A person skilled in the art, insofar as he has knowledge of the present invention, will easily choose suitable semiconductor switches, for example suitable FETs, for the control element or control elements of the simulation device while taking into account the electrical requirements for the simulation device.

Where a field-effect transistor is mentioned in the text below as an exemplary embodiment of a semiconductor switch of the first control element, of the second control element, and/or of the third control element, a signal controlling the applicable field-effect transistor of the first control element that is included in the first modified control signal is referred to as a "gate-source voltage" of the field-effect transistor that is controlled thereby.

Preferably, the first modified switch control signal includes four gate-source voltages for driving preferably four control terminals of the first control element, wherein each gate-source voltage of the four gate-source voltages is associated with one corresponding control terminal of the first control element. In the preferred embodiment of the first control element, in which the first control element includes at least four semiconductor switches, it is preferred that each of the four gate-source voltages controlled through the model code is connected in each case to one of the four semiconductor switches, thus in the example is connected to one of the four field-effect transistors of the first control element.

Preferably, provision is made that by applying the first modified switch control signal, which has four gate-source voltages, to the field-effect transistors of the first multistage converter of the first control element, a first dynamically variable simulation current is established, which in particular is influenced by the computation results of the model code executed on the computing unit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1A:
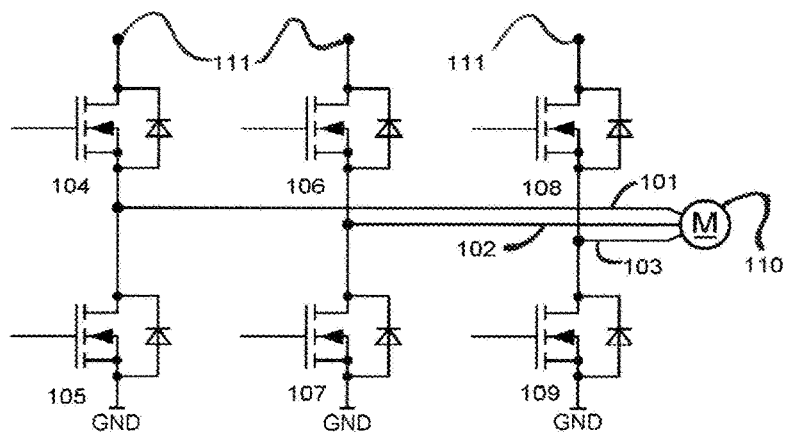
FIG. 1a is a schematic view of a circuit arrangement known from the prior art for driving a three-phase electric motor 110, wherein each half-bridge of a total of three half-bridges is connected to one phase terminal of the electric motor.
Figure 1B:
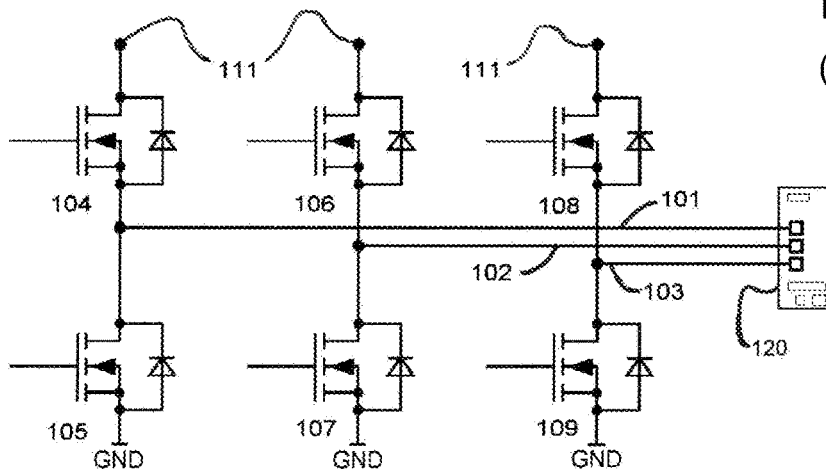
FIG. 1b is a schematic view of a circuit arrangement known from the prior art having firstly three half-bridges such as are contained in known control devices, and secondly an electric motor simulation device 120.
Figure 1C:
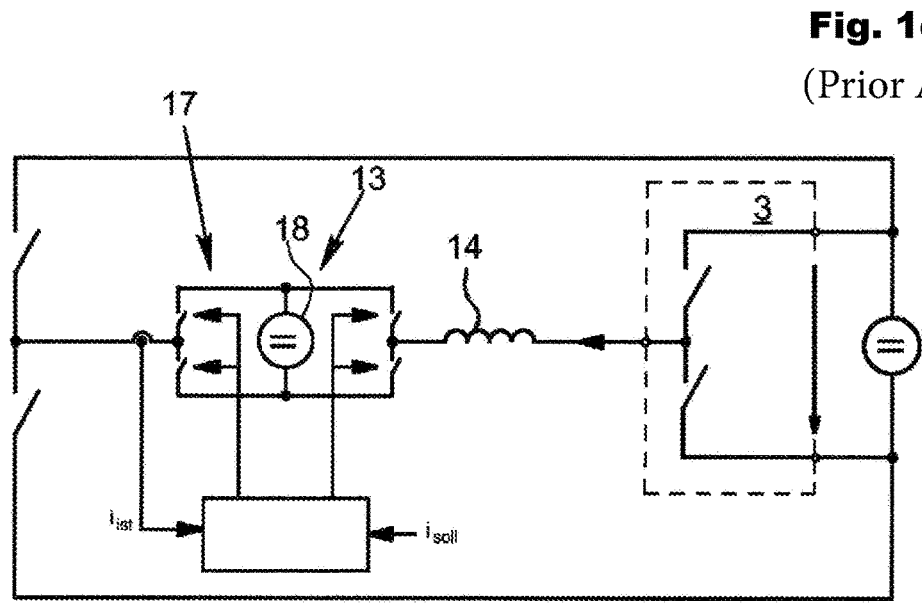
FIG. 1c is a circuit for emulating or simulating an electrical load at a terminal of a test circuit, as is already known from the document WO 2010 010022 A1.

FIGS. 1a, 1b, and 1c have already been covered within the framework of the introduction to the description in the discussion of the prior art. For this reason, further explanation of FIGS. 1a, 1b, 1c can be dispensed with in the text that follows.

The method according to the invention, in particular, and preferred operative connections with regard to the method of the relevant participating components of the simulation device Hx are described in detail using the embodiments of the simulation device Hx according to the invention, and its components, shown in FIG. 2 to FIG. 9.

The method according to the invention is provided for simulating a peripheral circuit arrangement that can be connected to a control device DUT. A simulation device Hx is electrically connected or can be electrically connected to the control device DUT, and the simulation device Hx has a first control element S1 with which a first simulation current Is1 that can be passed from a first load terminal D1 of the control device DUT to a first control element output Out1 of the first control element S1 can be influenced. The first control element S1 includes a first multistage converter, having at least a first semiconductor switch T11 with a first control terminal G11, a second semiconductor switch T12 with a second control terminal G12, a third semiconductor switch T13 with a third control terminal G13, and a fourth semiconductor switch T14 with a fourth control terminal G14. The simulation device Hx also includes a first semiconductor switch control Tc1 and a computing unit Cx. The computing unit Cx executes model code, wherein by means of the computing unit Cx and the model code a first switch control signal Ts1 is computed and provided for forwarding to the first semiconductor switch control Tc1. The first semiconductor switch control Tc1 has at least one first comparator Co1, and the first comparator Co1 includes a first comparator input E11 and a second comparator input E12 and a first comparator output X1. A first modulation signal A1 is derived from the first switch control signal Ts1 and is applied to the first comparator input E11. A first carrier signal F1 of a first carrier signal generator Cg1 is applied to the second comparator input E12, and a comparison of the first modulation signal A1 with the first carrier signal F1 is carried out by means of the first comparator Co1. During the course of the comparison, a pulse-width-modulated first gate-source voltage Ts11 is generated at the first comparator output X1 and applied to the first control terminal G11. The first simulation current Is1 is influenced by means of the first gate-source voltage Ts11.

In an improvement of the method according to the invention, the first semiconductor switch control Tc1 has at least a second comparator Co2, and the second comparator Co2 includes a third comparator input E21 and a fourth comparator input E22 and a second comparator output X2, and a second modulation signal A2 is derived from the first switch control signal Ts1 and applied to the third comparator input E21, and a second carrier signal F2 of a second carrier signal generator Cg2 is applied to the fourth comparator input E22, and a comparison of the second modulation signal A2 with the second carrier signal F2 is carried out by means of the second comparator Co2, wherein during the course of the comparison a pulse-width-modulated second gate-source voltage Ts12 is generated at the second comparator output X2 and applied to the second control terminal G12, and the first simulation current Is1 is influenced by means of the second gate-source voltage Ts12.

In another implementation of the method, the first carrier signal F1 and/or the second carrier signal F2 has or have a triangular waveform or a sawtooth waveform.

Preferably, the first carrier signal generator Cg1 and/or the second carrier signal generator Cg2 is included in the first semiconductor switch control Tc1. It is especially preferred for the first carrier signal generator Cg1 and/or the second carrier signal generator Cg2 and/or additional carrier signal generators Cg3 to Cg12 to be designed as triangle wave signal generators.

In another improvement of the method according to the invention, provision is made that in a first DUT operational state of the control device DUT, a first driver transistor Td1 of the control device DUT is switched to the conducting state, and in a second DUT operational state of the control device DUT, a second driver transistor Td2 of the control device DUT is switched to the conducting state, wherein a change from the first DUT operational state to the second DUT operational state and/or a change from the second DUT operational state to the first DUT operational state is/are associated with a transmission of a first inversion signal Ts4, and wherein the first inversion signal Ts4 influences the first carrier signal F1 and/or the second carrier signal F2. In the exemplary embodiments of the invention, it can be defined or is defined that not only a change from the first DUT operational state to the second DUT operational state but also a change from the second DUT operational state to the first DUT operational state is accompanied by a change in direction of the first simulation current Is1.

In the last-mentioned improvement of the method, it is preferred that the transmission of the first inversion signal Ts4 is electronically triggered by means of: a voltage measurement circuit that is equipped to measure a first output voltage Uout1 at the first control element output Out1, or a current measurement circuit that is equipped to measure the first simulation current Is1, or a general data interface of the control device DUT, or a debug interface of the control device DUT.

In this context, it is especially preferred that, during the course of an identification of the first inversion signal Ts4, triggering occurs to cause the first carrier signal generator Cg1 to change the first carrier signal F1 with regard to a time axis such that in a first constellation, in which a falling carrier signal edge is present at a first time of an identification of the first inversion signal Ts4, an immediate switchover to a rising carrier signal edge is executed, and in a second constellation, in which a rising carrier signal edge is present at a second time of an identification of the first inversion signal Ts4, an immediate switchover to a falling carrier signal edge is executed.

Preferably, after the first inversion signal Ts4 has been transmitted, it is delivered to the computing unit Cx, for example in order to incorporate the information contained in the first inversion signal Ts4 into the first switch control signal Ts1 and/or into the second switch control signal Ts2 and/or into the third switch control signal Ts3.

In another implementation of the method according to the invention, the effect is achieved that, in a time window of multiple periods of the first carrier signal F1, the first modulation signal A1 is equal to the second modulation signal A2 and, within the time window, firstly the first carrier signal F1 and the second carrier signal F2 have voltage versus time curves that are identical in terms of magnitude and secondly not only do local voltage minima of the first carrier signal F1 occur simultaneously with local voltage maxima of the second carrier signal F2, but also local voltage maxima of the first carrier signal F1 occur simultaneously with the local voltage minima of the second carrier signal F2.

In an improvement of the last-mentioned implementation of the method according to the invention, the time window of multiple periods of the first carrier signal F1 is extended so as to achieve the effect that, during an entire run time of the simulation, the first modulation signal A1 is equal to the second modulation signal A2, and during the entire run time of the simulation, firstly the first carrier signal F1 and the second carrier signal F2 have voltage versus time curves that are identical in terms of magnitude, and secondly not only do local voltage minima of the first carrier signal F1 occur simultaneously with local voltage maxima of the second carrier signal F2, but also local voltage maxima of the first carrier signal F1 occur simultaneously with the local voltage minima of the second carrier signal F2.

In another preferred implementation of the method according to the invention, the simulation device Hx additionally has: a second control element S2 including a second multistage converter and a second control element output Out2, a third control element S3 including a third multistage converter and a third control element output Out3, a second semiconductor switch control Tc2 including at least one fifth comparator Co5, wherein the fifth comparator Co5 includes a ninth comparator input E51 and a tenth comparator input E52 and a fifth comparator output X5, and a third semiconductor switch control Tc3 including at least one ninth comparator Co9, wherein the ninth comparator Co9 has a seventeenth comparator input E91 and an eighteenth comparator input E92 and a ninth comparator output X9, wherein the tenth comparator input E52 is equipped to have applied to it a fifth carrier signal F5 of a fifth carrier signal generator Cg5, and wherein the eighteenth comparator input E92 is equipped to have applied to it a ninth carrier signal F9 of a ninth carrier signal generator Cg9, and wherein the first carrier signal F1, the fifth carrier signal F5, and the ninth carrier signal F9 each have an identical carrier signal frequency, and a first time difference from a signal maximum of the first carrier signal F1 to a chronologically sequential signal maximum of the fifth carrier signal F5 is equal to a second time difference from the signal maximum of the fifth carrier signal F5 to a chronologically sequential signal maximum of the ninth carrier signal F9, and wherein the first control element output Out1 and the second control element output Out2 and the third control element output Out3 are electrically connected to one another.

In another improvement of the method, the model code is executed cyclically a number Nx times at fixed time intervals, which is to say at time intervals that are constant over time, by means of the computing unit Cx, and within each of the Nx fixed time intervals, each of the first switch control signal Ts1 for forwarding to the first semiconductor switch control Tc1 and/or the second switch control signal Ts2 for forwarding to the second semiconductor switch control Tc2 and/or the third switch control signal Ts3 for forwarding to the third semiconductor switch control Tc3 is or are calculated.

An advantage of the cyclic execution of the model code and the cyclic calculation of the first and/or second and/or third switch control signal(s) is that the simulation device Hx preferably responds in each cycle to a current change and/or voltage change on at least one interface of the control device DUT.

The cycle times in which the first switch control signal Ts1, the second switch control signal Ts2, and/or the third switch control signal Ts3 is/are calculated by means of the model code preferably are a few milliseconds or preferably even lie in the range of a few microseconds. For some years, a trend in the field of HIL simulations mentioned at the outset has been to no longer compute the executable model code solely by means of microprocessors, but instead to displace time-critical parts of the model code and time-critical executable sub-models to FPGA components or similar hardware components with freely programmable logic, by which means cycle times of less than one microsecond are achievable for the applicable part of the model code running on the FPGA, for example, which renders cyclic processing of a totality of all sub-models of the model code in what is called "hard real time" at all possible, for example for certain—especially complex—simulation models.

In accordance with another embodiment of the method according to the invention, the first switch control signal Ts1 is calculated by means of the model code as a function of a measured current value of the first simulation current Is1 and/or a measured voltage value of the first output voltage Uout1.

A particular advantage of the last-mentioned embodiment is that no exchange of digital data between the control device DUT and the simulation device Hx needs to take place in order to simulate the peripheral circuit arrangement, because the last-mentioned measured current value or the last-mentioned measured voltage value in this embodiment preferably includes sufficient information about the switching states of the first driver transistor Td1 and/or the second driver transistor Td2 for computation of the model code.

In another embodiment of the method starting from an Nth computation cycle of the model code, a measured current value of the first simulation current Is1 and/or a measured voltage value of the first output voltage Uout1 is or are measured in the Nth computation cycle, and in an (N+1)th computation cycle, the measured current value and/or the measured voltage value enter into the computation of the first switch control signal Ts1 by means of the model code in order to reduce a deviation of the measured current value of the first simulation current Is1 and/or in order to reduce a deviation of the measured voltage value of the first output voltage Uout1 from a corresponding ideal value conforming with the model code, wherein the (N+1)th computation cycle is the computation cycle that directly follows the Nth computation cycle.

A further advantage that results from the last-mentioned embodiment of the method is that a maximum time offset equal to one computation cycle time occurs between a determination of an actual value with regard to the simulation current Is1 and/or with regard to the first output voltage Uout1 on the one hand, and a corresponding computation of a correction by means of the model code with regard to the simulation current Is1 and/or with regard to the first output voltage Uout1 on the other hand, which leads to an improvement in the simulation results.

Figure 2:
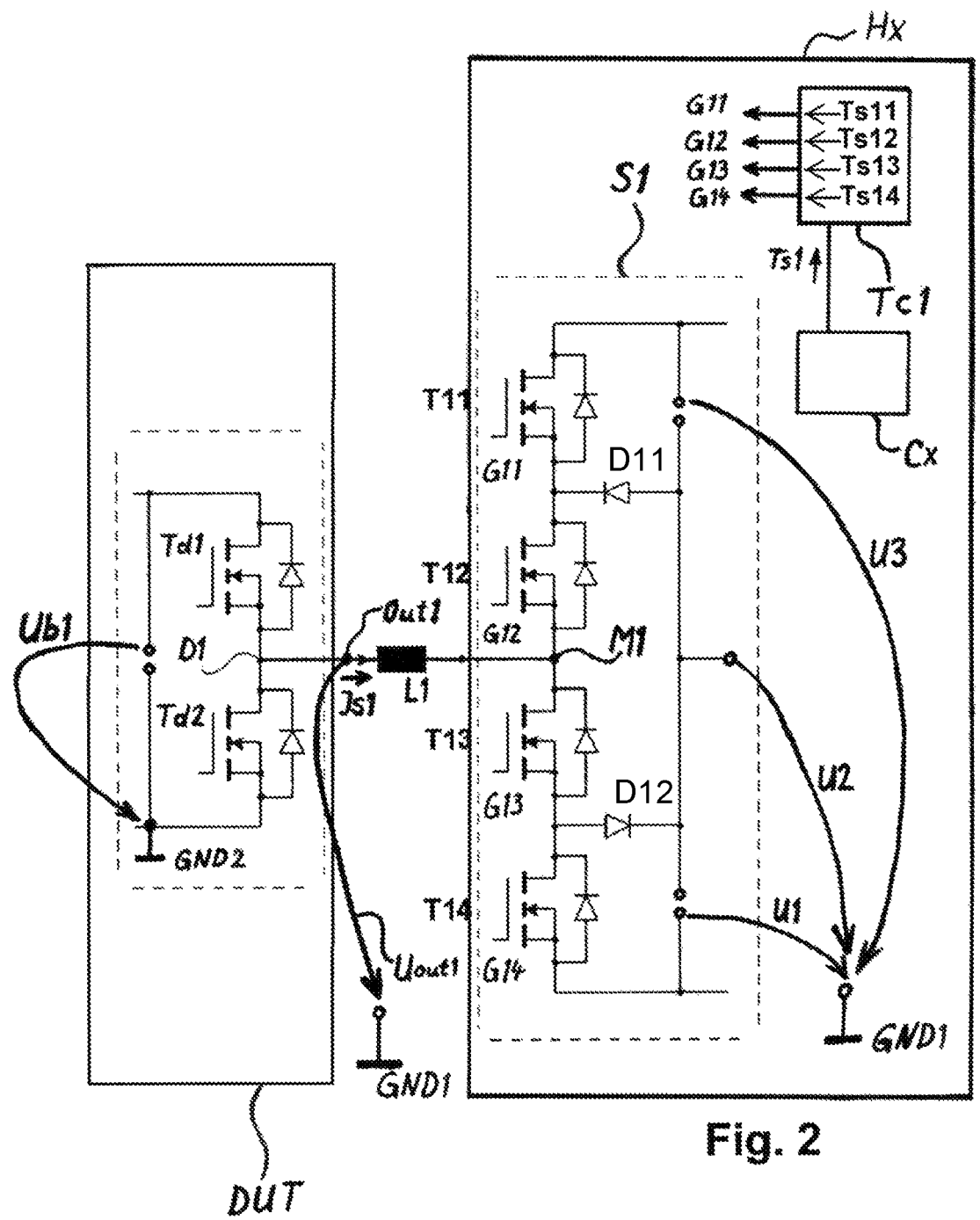
FIG. 2 is a schematic view of an embodiment of a simulation device according to the invention and a control device electrically connected to the simulation device.

The first control element S1 shown schematically in FIG. 2 includes at least four semiconductor switches, namely a first semiconductor switch T11 of the first control element S1, a second semiconductor switch T12 of the first control element S1, a third semiconductor switch T13 of the first control element S1, and a fourth semiconductor switch T14 of the first control element S1. The last-mentioned four semiconductor switches T11, T12, T13, T14 are wired to one another and to a first supply voltage U1 or a second supply voltage U2 or a third supply voltage U3 such that the first control element S1 has a first multistage converter.

In accordance with the teaching of the invention, a simulation device Hx for simulating a peripheral circuit arrangement that can be connected to a control device DUT is provided, wherein the simulation device Hx is electrically connected or can be electrically connected to the control device DUT, and wherein the simulation device Hx has a first control element S1 with which a first simulation current Is1 that can be passed from a first load terminal D1 of the control device DUT to a first control element output Out1 of the first control element S1 can be influenced, and wherein the first control element S1 includes a first multistage converter having at least a first semiconductor switch T11 with a first control terminal G11, a second semiconductor switch T12 with a second control terminal G12, a third semiconductor switch T13 with a third control terminal G13, and a fourth semiconductor switch T14 with a fourth control terminal G14, and wherein the simulation device Hx also includes a first semiconductor switch control Tc1 and a computing unit Cx, and the computing unit Cx is provided and equipped for execution of model code, wherein provision is made that, by means of the computing unit Cx and the model code, a first switch control signal Ts1 is computed and provided for forwarding to the first semiconductor switch control Tc1, and wherein the first semiconductor switch control Tc1 has at least one first comparator Co1, and the first comparator Co1 includes a first comparator input E11 and a second comparator input E12 and a first comparator output X1, the first comparator input E11 is equipped to have applied to it a first modulation signal A1 derived from the first switch control signal Ts1, and the second comparator input E12 is equipped to have applied to it a first carrier signal F1 of a first carrier signal generator Cg1, and a comparison of the first modulation signal A1 with the first carrier signal F1 can be carried out by means of the first comparator Co1, wherein during the course of the comparison a pulse-width-modulated first gate-source voltage Ts11 can be generated at the first comparator output X1 and wherein provision is made that the first gate-source voltage Ts11 is applied to the first control terminal G11, and the first simulation current Is1 can be influenced by means of the first gate-source voltage Ts11.

Preferred embodiments of the simulation device Hx are provided and equipped to carry out the method according to the invention or one of the described improvements and embodiments of the method according to the invention.

In especially preferred fashion, the at least four semiconductor switches of the first control element S1 are implemented as FETs. It is preferred here that these four semiconductor switches are connected to one another or to the first supply voltage U1 or the second supply voltage U2 or the third supply voltage U3 in the manner described as follows: The drain terminal of the first semiconductor switch T11 is connected to the third supply voltage U3; the source terminal of the first semiconductor switch T11 is connected to the drain terminal of the second semiconductor switch T12; the source terminal of the second semiconductor switch T12 and the drain terminal of the third semiconductor switch T13 and the terminal on the converter side of the first inductive component L1 are connected to one another; the source terminal of the third semiconductor switch T13 is connected to the drain terminal of the fourth semiconductor switch T14; the source terminal of the fourth semiconductor switch T14 is connected to the first supply voltage U1.

The control terminals G11, G12, G13, G14 of the first control element S1 are connected to corresponding outputs of a first semiconductor switch control Tc1.

The first control element S1 shown schematically in FIG. 2 additionally includes a first diode D11 and a second diode D12. The cathode of the first diode D11 is connected to the source terminal of the first semiconductor switch T11 and to the drain terminal of the second semiconductor switch T12. The anode of the first diode D11 can be connected to or is connected to the second supply voltage U2. During ongoing operation of the simulation device Hx, the second supply voltage U2 is present at the anode of the first diode D11. The anode of the second diode D12 is connected to the source terminal of the third semiconductor switch T13 and to the drain terminal of the fourth semiconductor switch T14. The cathode of the second diode D12 can be connected to or is connected to the second supply voltage. During ongoing operation of the simulation device Hx, the second supply voltage U2 is present at the cathode of the second diode D12.

In accordance with FIG. 2, the first control element S1 includes the first semiconductor switch T11, the second semiconductor switch T12, the third semiconductor switch T13, and the fourth semiconductor switch T14, wherein preferably each of these four semiconductor switches is a so-called FET, which is to say a field-effect transistor. Normally, a so-called bulk terminal and the source terminal of the same FET are electrically connected. A so-called "body diode," which is also referred to as a "reverse diode," one of which is inherently present in each of the FETs, is shown in the drawing but without a reference symbol. As is shown in FIG. 2, in each of these four semiconductor switches T11, T12, T13, T14, one cathode of an associated body diode is electrically connected to an associated drain terminal, and one anode of an associated body diode is electrically connected to an associated source terminal. Because the body diodes are not material to the invention, they are not described in greater detail.

The first supply voltage U1, the second supply voltage U2, the third supply voltage U3, and a first output voltage Uout1 are each referenced to a first reference voltage GND1.

According to another preferred embodiment, the second supply voltage U2 is equal to the first reference voltage GND1, wherein the third supply voltage U3 has a positive voltage value and the first supply voltage has a negative voltage value.

During the course of a signal conversion of the first switch control signal Ts1 by the first semiconductor switch control Tc1, the first modified switch control signal Ts11, Ts12, Ts13, Ts14 is produced. In accordance with the embodiment shown in FIG. 2 of the simulation device Hx with four semiconductor switches T11, T12, T13, T14 implemented as field-effect transistors, provision preferably is made that the first modified switch control signal has at least four gate-source voltages that are intended to be applied to preferably four control terminals G11, G12, G13, G14 of the first control element.

Each of the last-mentioned four gate-source voltages preferably is set with the first semiconductor switch control Tc1 as a function of the first switch control signal Ts1 such that a desired electrical potential arises at the first converter output M1. A potential gradient between the first load terminal D1 of the control device DUT and the first converter output M1 of the first control element S1 created by the electrical potential established at the first converter output M1 necessarily results in a first simulation current Is1 along the potential gradient.

Specifically, the last-named four gate-source voltages include: a first gate-source voltage Ts11 of the first modified switch control signal controlling the first semiconductor switch T11; a second gate-source voltage Ts12 of the first modified switch control signal controlling the second semiconductor switch T12; a third gate-source voltage Ts13 of the first modified switch control signal controlling the third semiconductor switch T13; and/or a fourth gate-source voltage Ts14 of the first modified switch control signal controlling the fourth semiconductor switch T14.

For example, a preferably digitally coded first switch control signal Ts1 is generated cyclically as a function of a computation result of the cyclically processed model code, and from this is subsequently generated a corresponding cyclically variable first modified switch control signal that has four associated cyclically variable gate-source voltages of the first modified switch control signal Ts11, Ts12, Ts13, Ts14. By means of the four gate-source voltages of the first modified switch control signal Ts11, Ts12, Ts13, Ts14, one or more of the semiconductor switches T11, T12, T13, T14 of the first control element is or are, for example, brought from a blocking state to a conductive state or vice versa for a time computed by model code in order to thus set the first simulation current Is1 based on the computation result of the model code.

It is preferred for the computing unit Cx to have an input (not shown in the drawing) for reading in a measured value of the first output voltage Uout1 and/or a measured value of the first simulation current Is1. If the computing unit has a corresponding input for reading in the measured first output voltage Uout1 or for reading in the measured first simulation current Is1, provision preferably is made that the computing unit Cx makes a change in the first switch control signal Ts1 as a function of the first output voltage Uout1 or as a function of the first simulation current Is1 by means of the model code and taking into account the measured first output voltage Uout1 or taking into account the measured first simulation current Is1.

Figure 3:
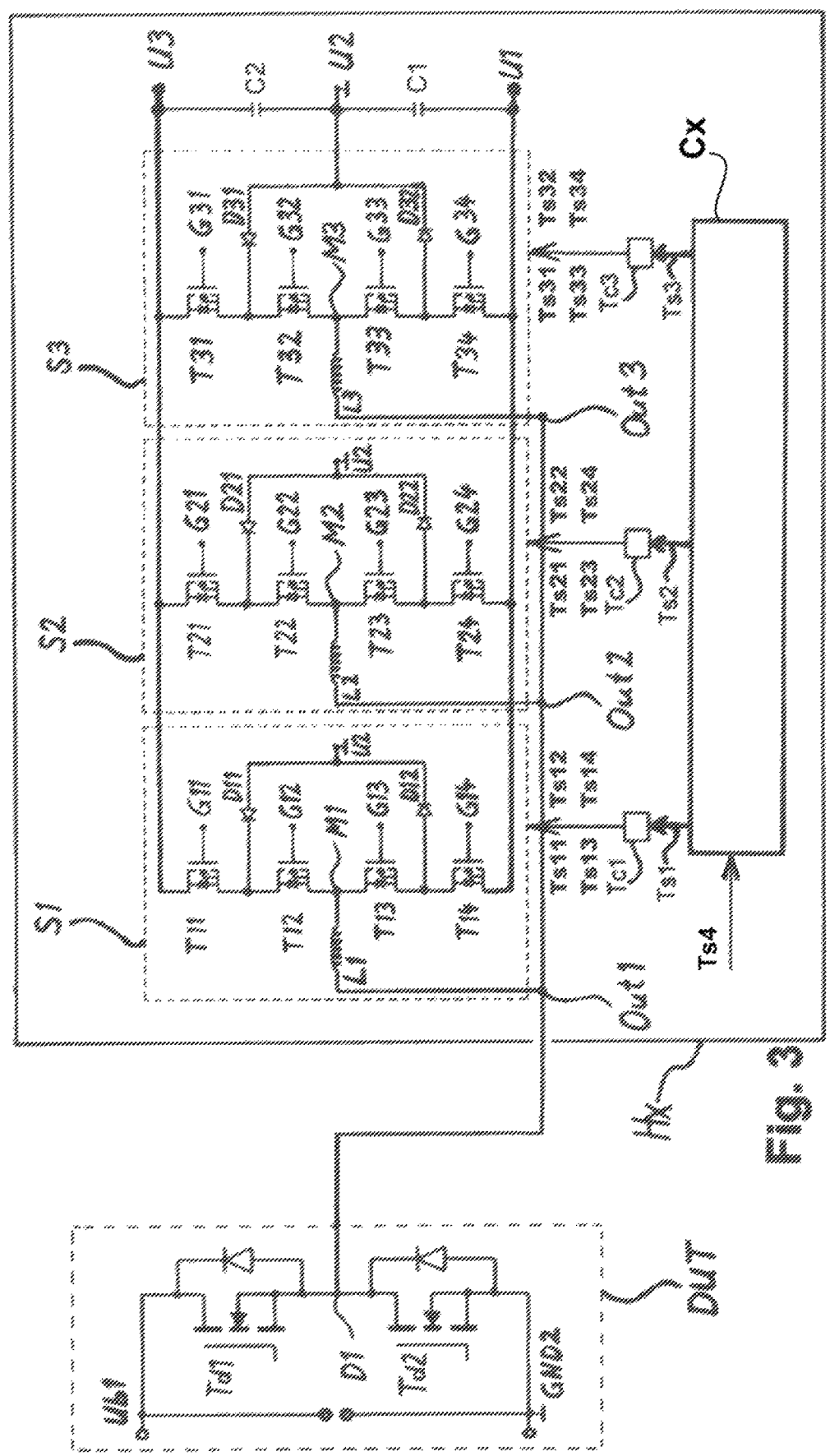
FIG. 3 is a schematic view of an embodiment of a simulation device according to the invention and a control device DUT electrically connected to the simulation device.

The exemplary embodiment of the simulation device Hx according to the invention disclosed in accordance with FIG. 3 shows, in addition to the first control element S1, a second control element S2 and a third control element S3. The simulation device Hx from FIG. 3 thus has a total of three control elements S1, S2, S3, which are essentially identical with respect to their structure in terms of hardware.

Preferably the semiconductor switches shown of the first control element S1, of the second control element S2, and of the third control element S3 are implemented as field-effect transistors, abbreviated as FETs. In addition, it is preferred to supply the three control elements S1, S2, S3 shown in FIG. 3 of the simulation device Hx with the first supply voltage U1, the second supply voltage U2, and the third supply voltage U3.

In the exemplary embodiment in accordance with FIG. 3, the third supply voltage U3 is connected to the drain terminals of the first semiconductor switch T11 of the first control element S1, of the first semiconductor switch T21 of the second control element S2, and/or of the first semiconductor switch T31 of the third control element S3.

In the exemplary embodiment in accordance with FIG. 3, the second supply voltage U2 is connected via diode(s) in the exemplary embodiment in FIG. 3 to the source terminals of the first semiconductor switch T11 of the first control element S1 via diode D11, of the first semiconductor switch T21 of the second control element S2 via diode D21, of the first semiconductor switch T31 of the third control element S3 via diode D31, wherein the anodes of the diodes D11, D21, and D31 are connected to the second supply voltage U2 of the third semiconductor switch T13 of the first control element S1 via diode D12, of the third semiconductor switch T23 of the second control element S2 via diode D22, of the third semiconductor switch T33 of the third control element S3 via diode D32, wherein the cathodes of the diodes D12, D22, and D32 are connected to the second supply voltage U2.

In the exemplary embodiment in accordance with FIG. 3, the second supply voltage U2 is connected via diode(s) to the drain terminals of the second semiconductor switch T12 of the first control element S1 via diode D11, of the second semiconductor switch T22 of the second control element S2 via diode D21, of the second semiconductor switch T32 of the third control element S3 via diode D31, of the fourth semiconductor switch T14 of the first control element S1 via diode D12, of the fourth semiconductor switch T24 of the second control element S2 via diode D22, and/or of the fourth semiconductor switch T34 of the third control element S3 via diode D32.

The first supply voltage U1 is connected to the source terminals of the fourth semiconductor switch T14 of the first control element S1, of the fourth semiconductor switch T24 of the second control element S2, and/or of the fourth semiconductor switch T34 of the third control element S3.

In the exemplary embodiments in accordance with FIGS. 2 and 3, the first converter output M1 associated with the first control element S1, which is electrically connected to a terminal on the converter side of a first inductive component L1, also forms an electrical connection point to the source terminal of the second semiconductor switch T12 of the first control element S1 and the drain terminal of the third semiconductor switch T13 of the first control element S1.

In the exemplary embodiment in accordance with FIG. 3, a second converter output M2 associated with the second control element S2, which is electrically connected to a terminal on the converter side of a second inductive component L2, also forms an electrical connection point to the source terminal of the second semiconductor switch T22 of the second control element S2 and the drain terminal of the third semiconductor switch T23 of the second control element S2.

In the exemplary embodiment in accordance with FIG. 3, a third converter output M3 associated with the third control element S3, which is electrically connected to a terminal on the converter side of a third inductive component L3, also forms an electrical connection point to the source terminal of the second semiconductor switch T32 of the third control element S3 and the drain terminal of the third semiconductor switch T33 of the third control element S3.

The computing unit Cx of the embodiment of the simulation device Hx in accordance with FIG. 3 provides the first switch control signal Ts1, the second switch control signal Ts2, and the third switch control signal Ts3 by means of the model code cyclically executed on the computing unit Cx in every cycle of the model code execution.

In the embodiment in accordance with FIG. 3, as in the embodiment in accordance with FIG. 2, the first switch control signal Ts1 is converted by the first semiconductor switch control Tc1 into the first modified switch control signal Ts11, Ts12, Ts13, Ts14. In a similar manner, it is shown in FIG. 3 that nonspecific—with respect to a form of a semiconductor switch—switch control signals, namely the first switch control signal Ts1, the second switch control signal Ts2, and the third switch control signal Ts3, are converted into semiconductor switch-specific, which is to say modified, switch control signals, for example gate-source voltages for FETs, which are proposed as preferred semiconductor switches of the first control element S1, of the second control element S2, and/or of the third control element S3.

In one embodiment of the invention in accordance with FIG. 3, the first multistage converter of the first control element S1 and the second multistage converter of the second control element S2 and the third multistage converter of the third control element S3 are constructed using FETs, and consequently the control terminals of the first control element S1, of the second control element S2, and of the third control element S3 are implemented as gate terminals of the FETs.

It is demonstrated as part of the present figure description, in particular with the use of the embodiments of the simulation device Hx according to the invention shown in FIGS. 2 and 3, that after a conversion of the first switch control signal Ts1 by the first semiconductor switch control Tc1 into the first modified switch control signal Ts11, Ts12, Ts13, Ts14. Preferably after a conversion of a second switch control signal Ts2 by the second semiconductor switch control Tc2 into a second modified switch control signal Ts21, Ts22, Ts23, Ts24, preferably after a conversion of a third switch control signal Ts3 by the third semiconductor switch control Tc3 into a third modified switch control signal Ts31, Ts32, Ts33, Ts34, an application of the first modified switch control signal Ts11, Ts12, Ts13, Ts14 to the first control element S1; preferably, an application of the second modified switch control signal Ts21, Ts22, Ts23, Ts24 to the second control element S2; and preferably, an application of the third modified switch control signal Ts31, Ts32, Ts33, Ts34 to the third control element S3 takes or take place.

If, for example, the semiconductor switches of the first control element S1 are implemented as FETs, as schematically shown in FIG. 2 and in FIG. 3, then preferably gate-source voltages of the first control element S1 are arranged as follows: a first control terminal G11 has a corresponding first gate-source voltage Ts11 applied to it, a second control terminal G12 has a corresponding second gate-source voltage Ts12 applied to it, a third control terminal G13 has a corresponding third gate-source voltage Ts13 applied to it, a fourth control terminal G14 has a corresponding fourth gate-source voltage Ts14 applied to it, and the last-mentioned four gate-source voltages preferably are included in the first modified switch control signal Ts11, Ts12, Ts13, Ts14.

In the embodiment in accordance with FIG. 3, the second switch control signal Ts2 is converted by the second semiconductor switch control Tc2 into a second modified switch control signal Ts21, Ts22, Ts23, Ts24, which has a semiconductor-switch-specific gate-source voltage for each of the four semiconductor switches T21, T22, T23, T24 shown of the second control element S2.

If, for example, the semiconductor switches of the second control element S2 are implemented as FETs, as schematically shown in FIG. 3, then preferably gate-source voltages of the second control element S2 are arranged as follows: a fifth control terminal G21 has a corresponding fifth gate-source voltage Ts21 applied to it, a sixth control terminal G22 has a corresponding sixth gate-source voltage Ts22 applied to it, a seventh control terminal G23 has a corresponding seventh gate-source voltage Ts23 applied to it, an eighth control terminal G24 has a corresponding eighth gate-source voltage Ts24 applied to it, and wherein the last-mentioned four gate-source voltages preferably are included in the second modified switch control signal Ts21, Ts22, Ts23, Ts24.

In the embodiment in accordance with FIG. 3, the third switch control signal Ts3 is converted by the third semiconductor switch control Tc3 into a third modified switch control signal Ts31, Ts32, Ts33, Ts34, which has a semiconductor-switch-specific gate-source voltage for each of the four semiconductor switches T31, T32, T33, T34 shown of the third control element S3.

If, for example, the semiconductor switches of the third control element S3 are implemented as FETs, as schematically shown in FIG. 3, then preferably gate-source voltages of the third control element S3 are arranged as follows: a ninth control terminal G31 has a corresponding ninth gate-source voltage Ts31 applied to it, a tenth control terminal G32 has a corresponding tenth gate-source voltage Ts32 applied to it, an eleventh control terminal G33 has a corresponding eleventh gate-source voltage Ts33 applied to it, a twelfth control terminal G34 has a corresponding twelfth gate-source voltage Ts34 applied to it, and wherein the last-mentioned four gate-source voltages preferably are included in the third modified switch control signal Ts31, Ts32, Ts33, Ts34.

In a preferred exemplary embodiment of the simulation device Hx in accordance with FIG. 3 it is preferred that the first control element output Out1, which is formed by the terminal on the control device side of the first inductive component L1, and the second control element output Out2, which is formed by the terminal on the control device side of the second inductive component L2, and the third control element output Out3, which is formed by the terminal on the control device side of the third inductive component L3.

Moreover, in the exemplary embodiment in accordance with FIG. 3 it is preferred that the first control element output Out1 and the second control element output Out2 and the third control element output Out3 are electrically connected to one another by an electrical jumper, and the electrical jumper is provided and equipped to be connected to the first load terminal D1 of the control device DUT.

The additional advantage resulting from the circuit arrangement in accordance with FIG. 3 resides in that the currents flowing through the first load terminal D1 can be emulated especially precisely by means of the simulation device Hx.

In the exemplary embodiment in accordance with FIG. 3 a first capacitor C1 and a second capacitor C2 preferably are connected to the three last-mentioned supply voltages U1, U2, U3 for smoothing of the first supply voltage U1 and of the third supply voltage U3, and specifically as follows: A first electrode of the first capacitor C1 is connected to the first supply voltage U1, and a second electrode of the first capacitor C1 is connected to the second supply voltage U2, and a first electrode of the second capacitor C2 is connected to the second supply voltage U2, and a second electrode of the second capacitor C2 is connected to the third supply voltage U3.

In a preferred embodiment of the simulation device Hx according to the invention, provision is made that the first multistage converter has at least a first, a second, a third, a fourth semiconductor switch T11, T12, T13, T14, wherein the first, the second, the third, the fourth semiconductor switch T11, T12, T13, T14 includes, in each case, at least one control terminal G11, G12, G13, G14, and wherein a first output voltage Uout1 influenced by the model code can be provided at the first control element output Out1 connected to the first multistage converter. It is an advantage of the last-mentioned embodiment that, by means of the first multistage converter, to whose four semiconductor switches T11, T12, T13, T14 the first modified switch control signal Ts11, Ts12, Ts13, Ts14 is applied, can be achieved cost-effectively and, moreover, highly dynamically variable current changes of the first simulation current Is1 calculated by the model code can be provided.

In accordance with another improvement of the simulation device Hx according to the invention, said device additionally has a second control element S2 and a third control element S3, wherein the second control element S2 is implemented as a second multistage converter and/or wherein the third control element S3 is implemented as a third multistage converter.

In the last-mentioned improvement of the simulation device Hx, the second control element S2 and the third control element S3 advantageously stand ready, along with the first control element S1, to implement an addition of output current of the first control element S1 plus output current of the second control element S2 plus output current of the third control element S3 by means of an electrical connection of the first control element output Out1, the second control element output Out2, and the third control element output Out3, wherein the total current resulting from the addition can be delivered to a first load terminal D1 of the control device DUT, such as is provided, for example, by means of a preferred simulation device Hx in accordance with FIG. 3. This total current is, as a general rule, more dynamically variable than a first simulation current Is1 that, for example, is delivered to a first load terminal D1 in accordance with FIG. 2 by a single first control element S1, which is to say without any addition to another output current from another control element.

The more dynamically a simulation current Is1 that is deliverable to the first load terminal D1 of the control device DUT can be varied by means of the simulation device Hx, the more realistically the simulation device Hx will be able to simulate, for test purposes, currents that will flow through the first load terminal D1 of the control device DUT in a later "actual" use.

In a preferred embodiment of the simulation device Hx according to the invention, the first multistage converter and/or the second multistage converter and/or the third multistage converter is or are implemented as three-stage converters. Surprisingly, an especially advantageous cost-benefit ratio is established for a simulation device Hx when at least the second multistage converter, which is included in the second control element S2, and optionally also the third multistage converter, which is included in the third control element S3, is or are implemented as three-stage converters. In particular, the highly dynamic nature of the last-mentioned total current achievable by means of the three-stage converter enters into the evaluation of the benefit here.

An embodiment of the simulation device Hx is especially preferred in which the second control element S2 is implemented as a second three-stage converter having a second group of at least four semiconductor switches T21, T22, T23, T24 and a second control element output Out2, and wherein the third control element S3 is implemented as a third three-stage converter having a third group of at least four semiconductor switches T31, T32, T33, T34 and a third control element output Out3, and the first control element output Out1 and the second control element output Out2 and the third control element output Out3 are electrically connected to one another.

In another embodiment of the simulation device Hx, during a cyclic execution of the model code on the computing unit Cx, provision is made for the model code at predefined time intervals to process a state message provided by the control device DUT, containing information that reflects an upcoming or completed state change of a first driver transistor Td1 of the control device DUT or an upcoming or completed state change of a second driver transistor Td2 of the control device DUT, in order to influence at least the first control element S1. This last-mentioned improvement of the simulation device Hx advantageously opens up an option to influence at least a first control element S1 either earlier or based on an enlarged database.

In another embodiment of the last-mentioned improvement of the simulation device Hx, a generation of the state message is provided at each measurement time of a measurement of the first output voltage Uout1, and/or the state message is placed in a causal relationship with a measured value of the measurement of the first output voltage Uout1 at the measurement time of the associated measurement of the first output voltage Uout1.

Additionally, in a further embodiment of the simulation device Hx, provision can be made that in one of the two last-mentioned embodiments of the simulation device Hx, the state message is provided and/or can be provided at predefined time intervals by a control device microprocessor (not shown in the drawing) associated with the control device DUT by means of control code that can be executed on the control device microprocessor.

The last-mentioned embodiment permits especially early adaptation of the switching state of the simulation device Hx to a variable first simulation current Is1, because the information about the state changes of the first driver transistor Td1 and of the second driver transistor Td2 of the control device DUT normally is first present in a control device microprocessor associated with the control device, since the control code is executed by means of the control device microprocessor in the control device DUT. Preferably, the control of the first driver transistor Td1 and of the second driver transistor Td2 takes place as a function of the computation result of the executed control code, in particular.

Preferably, the state message transmitted from the control device DUT to the simulation device Hx is further processed in the computing unit Cx of the simulation device Hx in order to exert a controlling influence on the switching states of the semiconductor switches T11, T12, T13, T14 associated with the first control element S1.

In another embodiment of the simulation device Hx according to the invention, the first control element S1 includes at least a first supply voltage terminal having a first supply voltage U1 and a second supply voltage terminal having a second supply voltage U2, and a third supply voltage terminal having a third supply voltage U3, wherein the third supply voltage U3 is greater than the second supply voltage U2, which is greater than the first supply voltage U1, wherein the first output voltage Uout1 can be set between the third supply voltage U3 and the first supply voltage U1 by an application of the first switch control signal Ts1 to the control terminals G11, G12, G13, G14 of the first control element S1, and wherein the first output voltage Uout1 is referenced to a first reference voltage GND1.

In accordance with an additional embodiment of the simulation device Hx according to the invention, an auxiliary signal connection (not shown in the drawing) is established or can be established from the computing unit Cx of the simulation device Hx to a control device microprocessor included in the control device DUT in order to influence the first and/or the second and/or the third switch control signal Ts1, Ts2, Ts3 as a function of information transmitted from the control device microprocessor to the computing unit Cx via auxiliary signal connection. The auxiliary signal connection reduces the load with respect to an available bandwidth of an optionally provided additional signal connection that is provided or can be provided for the purpose of data exchange between the control device DUT and the simulation device Hx. Both the auxiliary signal connection and the additional signal connection are optionally implemented as bidirectional data connections. Both the auxiliary signal connection and the additional signal connection can have electrical connecting lines, optical cables, and/or a radio connection, for example WLAN, as connecting media.

If the first control element S1 includes at least a first supply voltage terminal having a first supply voltage U1 and a second supply voltage terminal having a second supply voltage U2 and a third supply voltage terminal having a third supply voltage U3, provision is made in an especially preferred embodiment of the simulation device Hx that, within the first control element S1, with reference to a first reference voltage GND1, the third supply voltage U3 has a positive voltage value, and the first supply voltage U1 has a negative voltage value, and furthermore the following quantity relations apply: the second supply voltage U2 is identical to the first reference voltage GND1, which is to say U2=GND1; the second supply voltage U2 has an identical voltage difference in terms of magnitude both to the third supply voltage U3 and to the first supply voltage U1, which is to say |U3−U2|=|U2−U1|; the second reference voltage GND2 is greater than the first supply voltage U1 and less than the second supply voltage U2, which is to say U1<GND2<U2; a fourth supply voltage Ub1 is greater than the second supply voltage U2 and less than the third supply voltage U3, which is to say U2<Ub1<U3; and the difference formed from the fourth supply voltage Ub1 as minuend and the second supply voltage U2 as subtrahend is identical to the difference formed from the second supply voltage U2 as minuend and the second reference voltage GND2 as subtrahend, which is to say Ub1−U2=U2−GND2.

The last-mentioned embodiment can be used to advantage for an especially large number of simulation scenarios having practical relevance. Surprisingly, because of the symmetry in the last-mentioned embodiment and described in the equations |U3−U2|=|U2−U1| and |Ub1−U2|=|U2−GND2| it also turns out that model code with a less complex structure is needed for the simulation device Hx to simulate the peripheral circuit arrangement than would have been the case without the symmetry described with the last-mentioned equation.

In order to provide the fourth supply voltage Ub1, it is possible to provide, for example, an electrochemical energy storage device, preferably a storage battery.

A particular advantage of the method according to the invention is that the first multistage converter of the first control element S1 influences the first simulation current Is1 through the first semiconductor switch control Tc1 with an especially short delay once a corresponding request for changing the first simulation current Is1 has been calculated by means of the model code on the computing unit Cx, whereupon a corresponding first switch control signal Ts1 is output by the computing unit Cx to the first semiconductor switch control Tc1.

Achieving a desired change in the first simulation current Is1 with the least possible delay by means of the simulation device Hx is advantageous because the behavior of numerous peripheral circuit arrangements, which can include, e.g., inductive loads, can thus be emulated in a sufficiently precise manner. It is also advantageous that the method according to the invention can be executed using a simulation device Hx that can be achieved relatively cost-effectively and model code that is relatively uncomplicated in design, and hence cost-effective.

In a preferred improvement of the simulation device Hx according to the invention, the simulation device Hx is provided and equipped to carry out the method according to the invention for simulating a peripheral circuit arrangement that can be connected to a control device DUT, or to execute one of the described improvements or one of the described embodiments of the method according to the invention.

Figure 4:
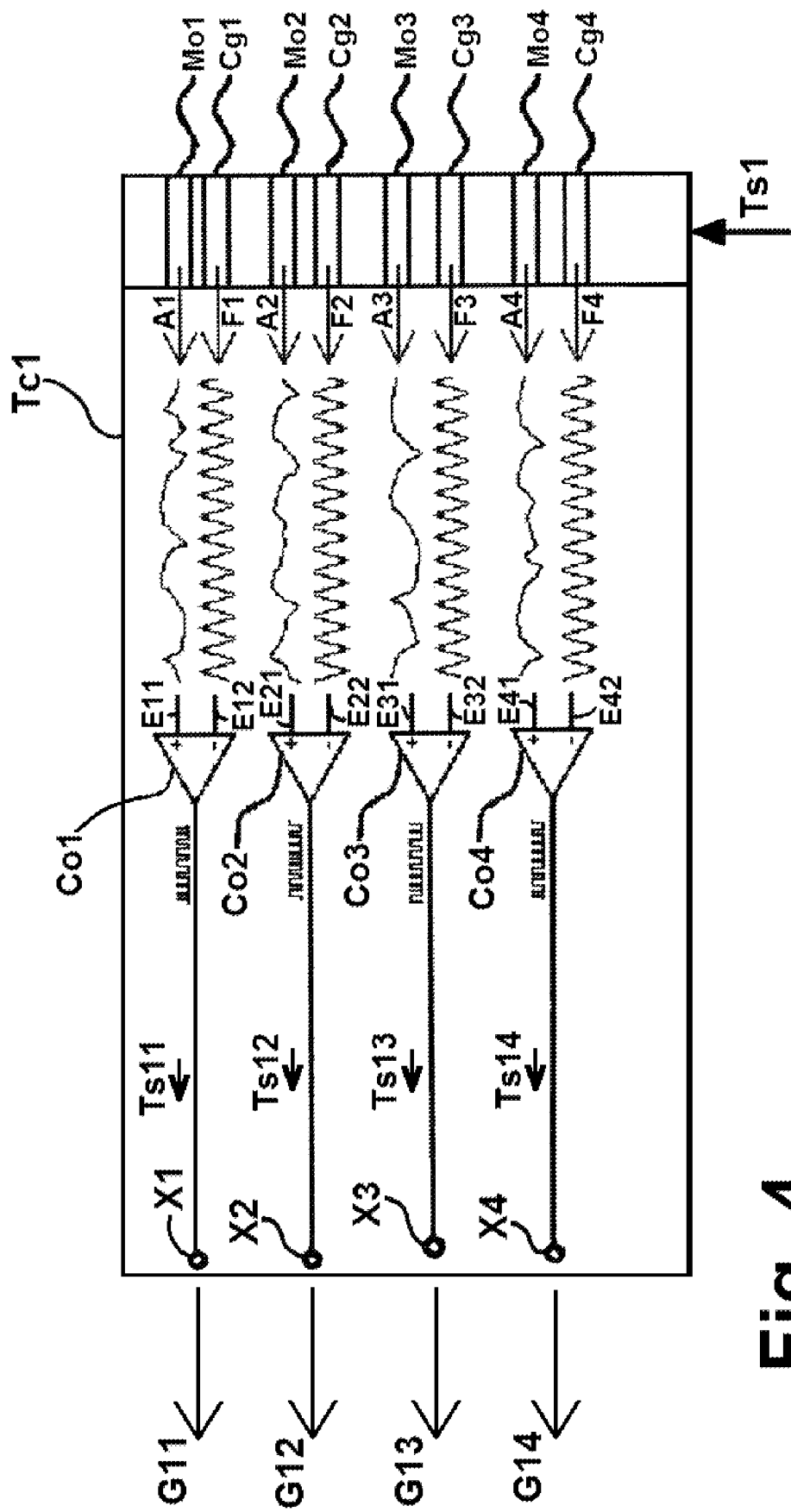
FIG. 4 is a preferred and schematically represented embodiment of a first semiconductor switch control Tc1 and its associated incoming and outgoing signals.

FIG. 4 shows a schematic representation of a preferred embodiment of a first semiconductor switch control Tc1 and its associated incoming and outgoing signals. The first switch control signal Ts1 originating from the computing unit Cx and serving as an input signal for the first semiconductor switch control Tc1 is preferably converted into modulation signals within the first semiconductor switch control Tc1, and preferably: a first modulation signal A1 is transmitted by a first modulation signal output Mo1 to a first comparator input E11 of a first comparator Co1; a second modulation signal A2 is transmitted by a second modulation signal output Mo2 to a third comparator input E21 of a second comparator Co2; a third modulation signal A3 is transmitted by a third modulation signal output Mo3 to a fifth comparator input E31 of a third comparator Co3; and/or a fourth modulation signal A4 is transmitted by a fourth modulation signal output Mo4 to a seventh comparator input E41 of a fourth comparator Co4.

Preferably, the first modulation signal A1, the second modulation signal A2, the third modulation signal A3, and the fourth modulation signal A4 are implemented as analog signals.

In an improvement of the invention a first carrier signal F1 that is provided by a first carrier signal generator Cg1 is applied to a second comparator input E12 of the first comparator Co1; a second carrier signal F2 that is provided by a second carrier signal generator Cg2 is applied to a fourth comparator input E22 of the second comparator Co2; a third carrier signal F3 that is provided by a third carrier signal generator Cg3 is applied to a sixth comparator input E32 of the third comparator Co3; and a fourth carrier signal F4 that is provided by a fourth carrier signal generator Cg4 is applied to an eighth comparator input E42 of the fourth comparator Co4.

In addition, the improvement of the invention preferably includes a first comparator input X1, associated with the first comparator Co1, that is equipped to output the first gate-source voltage Ts11; a second comparator input X2, associated with the second comparator Co2, that is equipped to output the second gate-source voltage Ts12; a third comparator input X3, associated with the third comparator Co3, that is equipped to output the third gate-source voltage Ts13; and a fourth comparator input X4, associated with the fourth comparator Co2, that is equipped to output the fourth gate-source voltage Ts14.

In another preferred embodiment of the invention, during the entire execution time of the method according to the invention, or at least during the duration of a majority of periods of the first carrier signal F1, firstly the first carrier signal F1 and the third carrier signal F3 are coincident, and secondly the second carrier signal F2 and the fourth carrier signal F4 are coincident.

Figure 5:
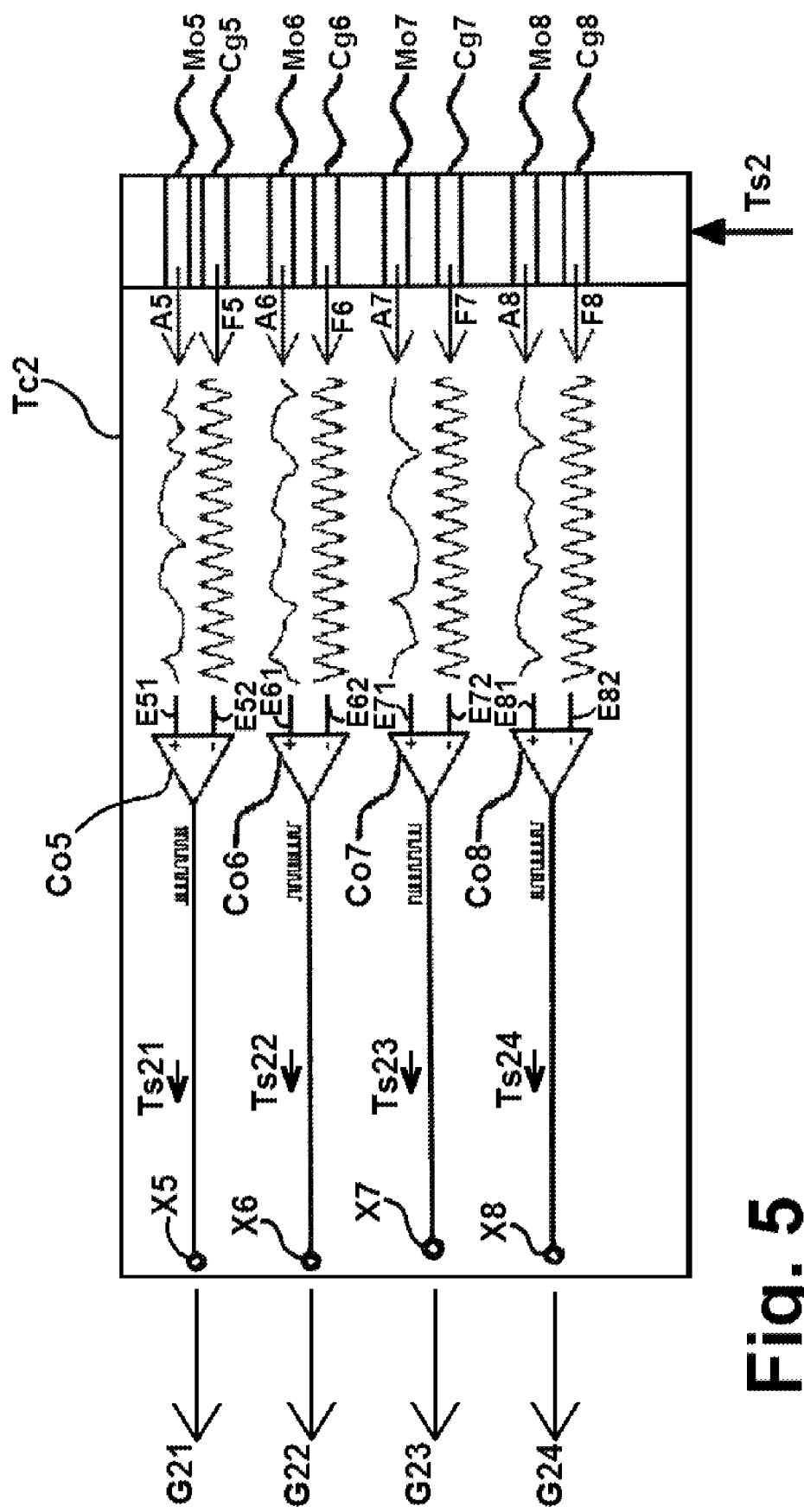
FIG. 5 is a preferred and schematically represented embodiment of a second semiconductor switch control Tc2 and its associated incoming and outgoing signals.

FIG. 5 shows a schematic representation of a preferred embodiment of a second semiconductor switch control Tc2 and its associated incoming and outgoing signals. The second switch control signal Ts2 originating from the computing unit Cx and serving as an input signal for the second semiconductor switch control Tc2 is preferably converted into modulation signals within the second semiconductor switch control Tc2, and preferably: a fifth modulation signal A5 is transmitted by a fifth modulation signal output Mo5 to a ninth comparator input E51 of a fifth comparator Co5; a sixth modulation signal A6 is transmitted by a sixth modulation signal output Mo6 to an eleventh comparator input E61 of a sixth comparator Co6; a seventh modulation signal A7 is transmitted by a seventh modulation signal output Mo7 to a thirteenth comparator input E71 of a seventh comparator Co7; and an eighth modulation signal A8 is transmitted by an eighth modulation signal output Mo8 to a fifteenth comparator input E81 of an eighth comparator Co8.

Preferably, the fifth modulation signal A5, the sixth modulation signal A6, the seventh modulation signal A7, and the eighth modulation signal A8 are implemented as analog signals.

In an improvement of the invention a fifth carrier signal F5 that is provided by a fifth carrier signal generator Cg5 is applied to a tenth comparator input E52 of the fifth comparator Co5; a sixth carrier signal F6 that is provided by a sixth carrier signal generator Cg6 is applied to a twelfth comparator input E62 of the sixth comparator Co6; a seventh carrier signal F7 that is provided by a seventh carrier signal generator Cg7 is applied to a fourteenth comparator input E72 of the seventh comparator Co7; an eighth carrier signal F8 that is provided by an eighth carrier signal generator Cg8 is applied to a sixteenth comparator input E82 of the eighth comparator Co8.

In addition, the improvement of the invention preferably includes a fifth comparator input X5, associated with the fifth comparator Co5, that is equipped to output the fifth gate-source voltage Ts21; a sixth comparator input X6, associated with the sixth comparator Co6, that is equipped to output the sixth gate-source voltage Ts22; a seventh comparator input X7, associated with the seventh comparator Co7, that is equipped to output the seventh gate-source voltage Ts23; and an eighth comparator input X8, associated with the eighth comparator Co8, that is equipped to output the eighth gate-source voltage Ts24.

In another preferred embodiment of the invention, during the entire execution time of the method according to the invention, or at least during the duration of a majority of periods of the fifth carrier signal F5, firstly the fifth carrier signal F5 and the seventh carrier signal F7 are coincident, and secondly the sixth carrier signal F6 and the eighth carrier signal F8 are coincident.

Figure 6:
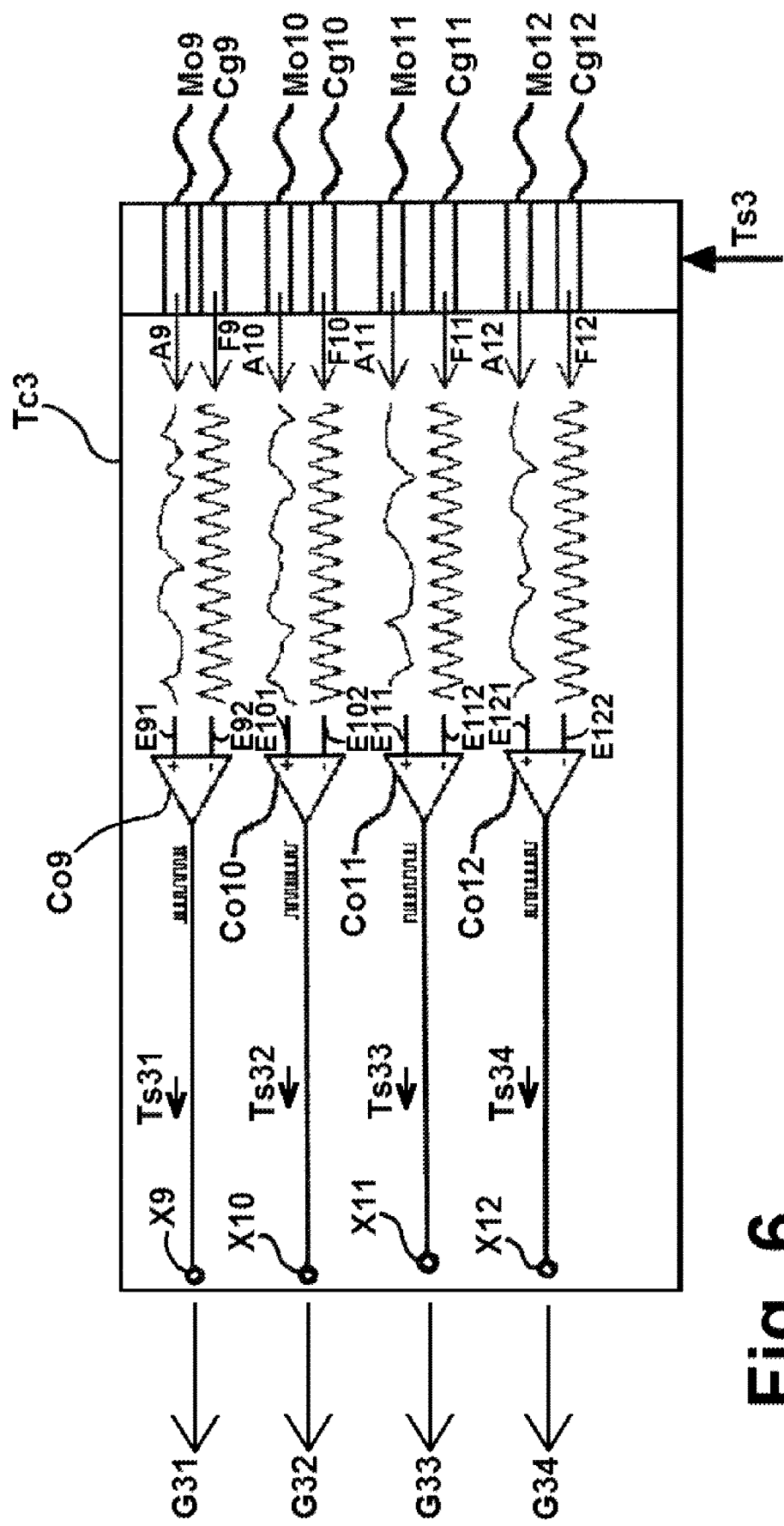
FIG. 6 is a preferred and schematically represented embodiment of a third semiconductor switch control Tc3 and its associated incoming and outgoing signals.

FIG. 6 shows a schematic representation of a preferred embodiment of a third semiconductor switch control Tc3 and its associated incoming and outgoing signals. The third switch control signal Ts3 originating from the computing unit Cx and serving as an input signal for the third semiconductor switch control Tc3 is preferably converted into modulation signals within the third semiconductor switch control Tc3, and preferably: a ninth modulation signal A9 is transmitted by a ninth modulation signal output Mo9 to a seventeenth comparator input E91 of a ninth comparator Co9; a tenth modulation signal A10 is transmitted by a tenth modulation signal output Mo10 to a nineteenth comparator input E101 of a tenth comparator Co10; an eleventh modulation signal A11 is transmitted by an eleventh modulation signal output Mo11 to a twenty-first comparator input E111 of an eleventh comparator Co11; and a twelfth modulation signal A12 is transmitted by a twelfth modulation signal output Mo12 to a twenty-third comparator input E121 of a twelfth comparator Co12.

Preferably, the ninth modulation signal A9, the tenth modulation signal A10, the eleventh modulation signal A11, and the twelfth modulation signal A12 are implemented as analog signals.

In an improvement of the invention a ninth carrier signal F9 that is provided by a ninth carrier signal generator Cg9 is applied to an eighteenth comparator input E92 of the ninth comparator Co9; a tenth carrier signal F10 that is provided by a tenth carrier signal generator Cg10 is applied to a twentieth comparator input E102 of the tenth comparator Co10; an eleventh carrier signal F11 that is provided by an eleventh carrier signal generator Cg11 is applied to a twenty-second comparator input E112 of the eleventh comparator Co11; and a twelfth carrier signal F12 that is provided by a twelfth carrier signal generator Cg12 is applied to a twenty-fourth comparator input E122 of the twelfth comparator Co12.

In addition, the improvement of the invention preferably includes a ninth comparator input X9, associated with the ninth comparator Co9, that is equipped to output the ninth gate-source voltage Ts31; a tenth comparator input X10, associated with the tenth comparator Co10, that is equipped to output the tenth gate-source voltage Ts32; an eleventh comparator input X11, associated with the eleventh comparator Co11, that is equipped to output the eleventh gate-source voltage Ts33; and a twelfth comparator input X12, associated with the twelfth comparator Co12, that is equipped to output the twelfth gate-source voltage Ts34.

In another preferred embodiment of the invention, during the entire execution time of the method according to the invention, or at least during the duration of a majority of periods of the ninth carrier signal F9, firstly the ninth carrier signal F9 and the eleventh carrier signal F11 are coincident, and secondly the tenth carrier signal F10 and the twelfth carrier signal F12 are coincident.

Figure 7:
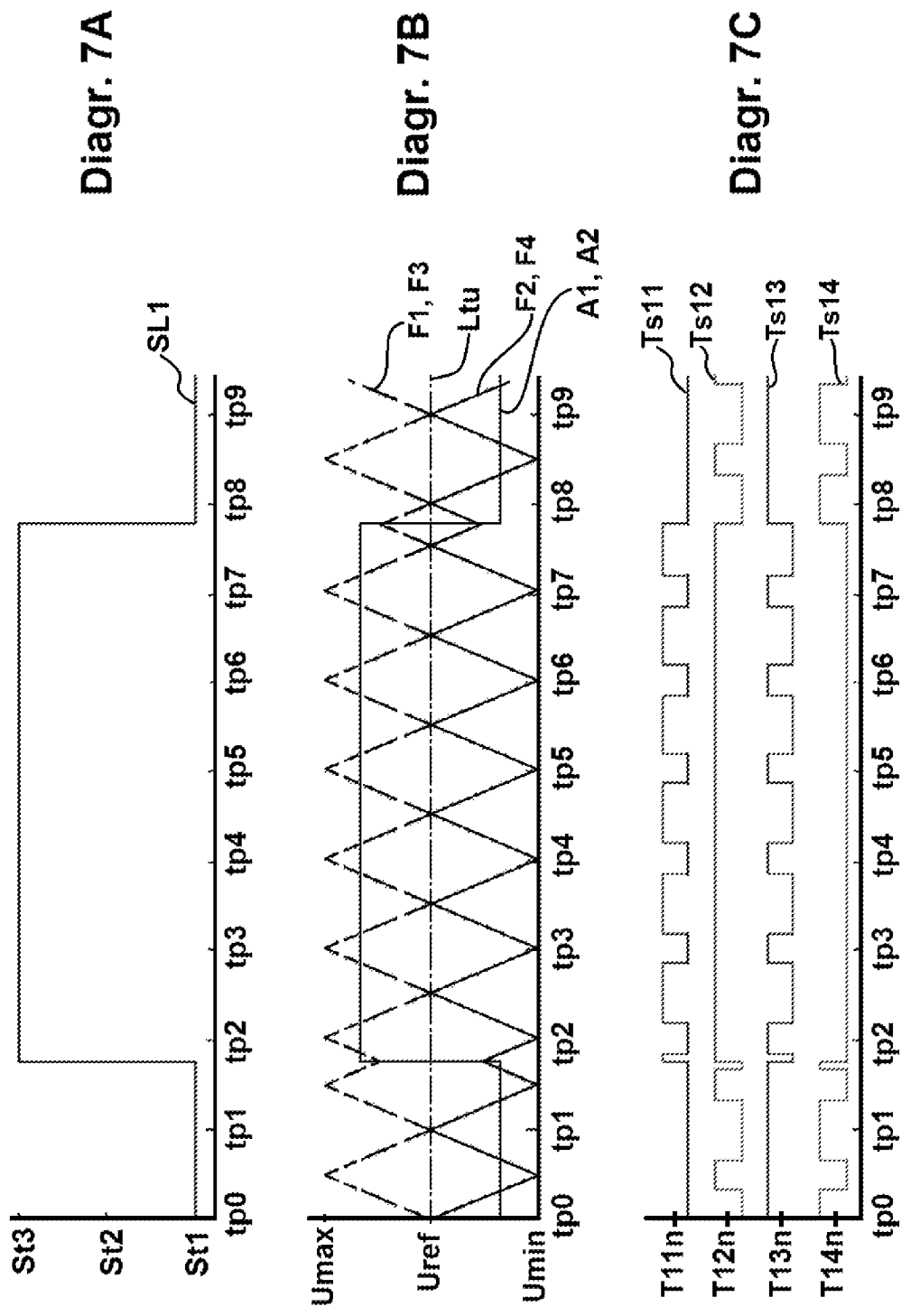
FIG. 7 is a schematic representation, illustrated by way of example, of time behaviors of selected signals, voltages, and their interactions, especially at times when a state change of the control device takes place.

The interactions between carrier signals and modulation signals can be explained very descriptively using the three schematic diagrams 7A to 7C in FIG. 7, which show signal behaviors over time by way of example. The representation of the time functions in diagrams 7A, 7B, and 7C show identical abscissa axes with equidistant time steps beginning at the time tp0 and ending at the time tp9.

In diagram 7A of FIG. 7, two state changes of a control device DUT are shown with the aid of an example, namely with the aid of a state curve SL1. Between the time tp1 and the time tp2, the control device DUT executes a first state change from a first state St1 to a third state St3. Subsequently, between the time tp7 and the time tp8, the control device DUT executes a second state change, namely from the third state St3 to the first state St1. A state change of the control device DUT is present at times when a change in current direction of the first simulation current Is1 is brought about by the control device DUT, for example. Because, in the last-mentioned example, the first state St1 indicates a first current direction of the first simulation current Is1 and the third state St3 indicates a current direction of the first simulation current Is1 opposite the first current direction, the diagram 7A shows, in particular, that a first change in current direction of the first simulation current Is1 is caused by the control device DUT between the time tp1 and the time tp2, and in addition a second change in current direction of the first simulation current Is1 is caused between the time tp7 and the time tp8. A second state St2 of the control device DUT, which can reflect an interruption in the first simulation current Is1, for example, is briefly passed through in the diagram 7A in the course of a state change from St1 to St3 or from St3 to St1. The behavior of the two state changes shown here as a rectangular curve represents an idealized approximation, which is to say that with appropriately high resolution for the time axis, in practice the state curve SL1 is not a rectangular curve but rather rising and falling edges of the state curve SL1 have a finite positive or negative slope.

In diagram 7B of FIG. 7, a time axis that is identical to the time axis from diagram 7A is shown as an abscissa axis. Referring to diagram 7A, it is shown in diagram 7B that the above-described state changes of the control device DUT lead to changes in the first modulation signal A1 and the second modulation signal A2.

Diagram 7B of FIG. 7 shows, in particular, preferred embodiments of the first carrier signal F1 and of the second carrier signal F2, namely so-called triangular signals. The first carrier signal F1, represented with a dashed triangular signal line, and the second carrier signal F2, represented with a solid triangular signal line, are preferably mirror images about a time axis Ltu. The time axis Ltu in diagram 7B is drawn as an abscissa axis with a dot-and-dash line. The time axis Ltu in diagram 7B intersects the ordinate axis at a reference voltage Uref. Plotted on the ordinate axis of diagram 7B are firstly a maximum voltage Umax, which is greater than the reference voltage Uref, and secondly a minimum voltage Umin, which is less than the reference voltage Uref. Consequently: Umax>Uref>Umin.

If the reference voltage Uref is assigned a voltage value of N volts, as in the exemplary embodiment shown in 7B, then the time axis Ltu represents a voltage limit at a voltage level of N volts. If N=zero, as is preferred, then the time axis Ltu divides a negative voltage range and a positive voltage range from one another, which is to say that in an example with the reference voltage Uref=0 volts, the first carrier signal F1 is associated with the positive voltage range and the second carrier signal F2 is associated with the negative voltage range.

It is preferred that the time-dependent first instantaneous voltage values of the first carrier signal F1 oscillate between the reference voltage Uref and the maximum voltage Umax, where: Uref first instantaneous voltage values≤Umax.

In addition, it is preferred that the time-dependent second instantaneous voltage values of the second carrier signal F2 oscillate between the reference voltage Uref and the minimum voltage Umin, where: Umin≤second instantaneous voltage values≤Uref.

Because the first modulation signal A1 is equal to the second modulation signal A2 in a preferred embodiment of the invention, the corresponding curves A1, A2 in diagram 7B of FIG. 7 are shown superimposed over one another.

For the purpose of further simplification of the representation, in the exemplary embodiment according to the sketch in diagram 7B, the first modulation signal A1 and also the second modulation signal A2 are implemented as a rectangular curve, with the result that the following signal interactions of the exemplary embodiment can be described easily.

It has already been described that the first modulation signal A1 is applied to the first comparator input E11, and the first carrier signal F1 is applied to the second comparator input E12, and a comparison of the first modulation signal A1 with the first carrier signal F1 is carried out by means of the first comparator Co1, wherein during the course of the comparison a pulse-width-modulated first gate-source voltage Ts11 is generated at the first comparator output X1 and applied to the first control terminal G11.

According to the exemplary embodiment shown,—in a manner similar to that described above—the second modulation signal A2 is applied to the second comparator input E21, and the second carrier signal F2 is applied to the fourth comparator input E22, and a comparison of the second modulation signal A2 with the second carrier signal F2 is carried out by means of the second comparator Co2, wherein during the course of the comparison a pulse-width-modulated second gate-source voltage Ts12 is generated at the second comparator output X2 and applied to the second control terminal G12.

Preferably, any additional comparators that may be provided, in particular the third comparator Co3 and the fourth comparator Co4, are operated in a manner comparable to the first comparator Co1 and the second comparator Co2. As a general rule, provision can be made that an individually adapted modulation signal and an individually adapted carrier signal are associated with each of the said comparators at the corresponding inputs, wherein provision can optionally be made that each modulation signal and each carrier signal has a different signal behavior that is definable or is defined by means of the model code in each case. However, provision is made according to a preferred embodiment of the invention that predefined inputs of different comparators of the first semiconductor switch control Tc1 have identical modulation signals and/or identical carrier signals applied to them.

Thus, in another embodiment of the invention provision is made that for application to the first semiconductor switch control Tc1, firstly the first modulation signal A1, the second modulation signal A2, the third modulation signal A3, and the fourth modulation signal A4 are identical, and secondly the first carrier signal F1 matches the third carrier signal F3 and the second carrier signal F2 matches the fourth carrier signal F4. Mathematically expressed, the following equations apply, preferably within a time interval of multiple periods of the first carrier signal F1 for the last-mentioned embodiment of the invention:

$$A1=A2=A3=A4$$

$$F1=F3$$

$$F2=F4.$$

In the last-mentioned—and illustrated in FIG. 7—embodiment of the invention, the time axis Ltu that extends at the voltage of the reference voltage Uref preferably forms an axis of reflection, see also diagram 7B. In this design, the first carrier signal F1 and the third carrier signal F3 oscillate between the time axis Ltu and the maximum voltage Umax, wherein F1=F3, and the second carrier signal F2 and the fourth carrier signal F4 oscillate between the time axis Ltu and the minimum voltage Umin, wherein F2=F4. A reflection of the first carrier signal F1 and of the third carrier signal F3 at the axis of reflection formed by the time axis Ltu thus results in a mirror image of the two last-mentioned carrier signals F1, F3 below the depicted time axis Ltu, namely in the form of the second carrier signal F2 and the fourth carrier signal F4.

In the exemplary embodiment represented in diagram 7B, a first anticyclical slope sign change of both the first carrier signal F1 and the second carrier signal F2 is carried out substantially simultaneously with the first change in current direction shown in diagram 7A, which is to say simultaneously with a first state transition from the first state St1 to the third state St3 of the control device DUT. The term "anticyclical slope sign change" is explained below with reference to FIG. 7. In the absence of a state change of the control device DUT (for example, in the absence of a rising/falling edge of the state curve SL1 in diagram 7A), a periodically repeating "normal cycle" of the first carrier signal F1 is present, wherein the first carrier signal F1 oscillates cyclically between the maximum voltage Umax and the reference voltage Uref, and the slope of the first carrier signal F1 executes a sign change each time the maximum voltage Umax is reached and each time the reference voltage Uref is reached.

At the time of a state change of the control device DUT, which is to say—as shown in FIG. 7—at the time of a rising and a falling edge of the state curve SL1, in the exemplary embodiment from the diagram in 7B the "normal cycle" of the first carrier signal F1 is interrupted such that a sign change of the slope of the first carrier signal F1 is carried out substantially simultaneously with the relevant state change (rising/falling edge of the state curve SL1), wherein preferably the sign change is carried out by means of the first carrier signal generator Cg1, wherein for this purpose it is especially preferred for an appropriate trigger signal for triggering the sign change of the slope of the first carrier signal F1 to be delivered to the first carrier signal generator Cg1, for example by means of the computing unit Cx.

The second carrier signal F2 is influenced in a similar manner in the exemplary embodiment shown: At the time of a state change of the control device DUT, which is to say—as shown in FIG. 7—at the time of a rising and a falling edge of the state curve SL1, the "normal cycle" of the second carrier signal F2 is interrupted in the exemplary embodiment from the diagram in 7B in such a manner that a sign change of the slope of the second carrier signal F2 is carried out substantially simultaneously with the relevant state change (rising/falling edge of the state curve SL1), wherein preferably the sign change is carried out by means of the second carrier signal generator Cg2, wherein for this purpose it is especially preferred for an appropriate trigger signal for triggering the sign change of the slope of the second carrier signal F2 to be delivered to the second carrier signal generator Cg2, for example by means of the computing unit Cx.

Preferably, a procedure similar or identical to the last-mentioned influencing of the first carrier signal F1 is followed for the third carrier signal F3, and a procedure similar or identical to the last-mentioned influencing of the second carrier signal F2 is followed for the fourth carrier signal F4.

One of the advantages of the sign change of the slope of the first carrier signal F1 and sign change of the slope of the second carrier signal F2 and preferably sign change of the slope of the third carrier signal F3 and sign change of the slope of the fourth carrier signal F4 that are triggered or can be triggered by a state change of the control device DUT—for example by a change in current direction of the first simulation current Is1—(and that are described in the preceding two paragraphs) is evident in that the corresponding magnitude of the first simulation current Is1 shortly after the state change does not change more abruptly than in the "normal cycle" (the normal cycle is present in the carrier signal cycles in which no state change of the control device DUT occurs), which is to say that transient processes in the control of the first simulation current Is1 are advantageously avoided or at least reduced as compared to a use of carrier signals implemented without the above-described sign change.

It should be noted that the exemplary embodiment of the invention shown in diagram 7B, in which the first modulation signal A1 and the second modulation signal A2 firstly are coincident, and secondly are implemented as square-wave signals, should not lead one to conclude that the modulation signals that can be used for the invention must always be implemented as superimposed square-wave signals. On the contrary, provision is made in other exemplary embodiments for one or more or all modulation signal(s) to be individually adapted by means of the model code, and thus to provide appropriately adapted analog or digital modulation signals for the comparators of the semiconductor switch control Tc1, Tc2, Tc3.

Using the present description for the diagrams 7A and 7B as a basis, additional embodiments of the invention are described with reference to diagram 7C.

In one embodiment of the invention, results of the comparisons of the first modulation signal A1 with the first carrier signal F1 via the first comparator Co1, of the second modulation signal A2 with the second carrier signal F2 via the second comparator Co2, of the third modulation signal A3 with the third carrier signal F3 via the third comparator Co3, and of the fourth modulation signal A4 with the fourth carrier signal F4 via the fourth comparator Co4 are used for providing the first gate-source voltage Ts11, the second gate-source voltage Ts12, the third gate-source voltage Ts13, and the fourth gate-source voltage Ts14.

A predefined value range, which preferably is influenced by an embodiment of an applicable comparator voltage supply (not shown in the drawings), is associated with each of the said gate-source voltages Ts11, Ts12, Ts13, Ts14. Depending on the driving of the first comparator Co1, the first gate-source voltage Ts11 is either above or below a predefined first midpoint voltage T11$n$ associated with the first gate-source voltage. Depending on the driving of the second comparator Co2, the second gate-source voltage Ts12 is either above or below a predefined second midpoint voltage T12$n$ associated with the first gate-source voltage. Depending on the driving of the third comparator Co3, the third gate-source voltage Ts13 is either above or below a predefined third midpoint voltage T13$n$ associated with the third gate-source voltage. Depending on the driving of the fourth comparator Co4, the fourth gate-source voltage Ts14 is either above or below a predefined fourth midpoint voltage T14$n$ associated with the first gate-source voltage. The ordinate axis of diagram 7C must not to be understood to mean that the first, second, third, and fourth midpoint voltages T11$n$, T12$n$, T13$n$, T14$n$ each have different magnitudes. Generally speaking, however, exemplary embodiments can be achieved in which the said four midpoint voltages T11$n$, T12$n$, T13$n$, T14$n$ differ from one another. In a preferred improvement of the invention, provision is made that the four midpoint voltages T11$n$, T12$n$, T13$n$, T14$n$ are identical, and thus it is true in the last-mentioned improvement that: T11$n$=T12$n$=T13$n$=T14$n$.

When FIGS. 2, 3, 4, and 7 are considered in combination, it becomes even clearer how, at every point in time from tp0 to tp9, the time-varying gate voltages Ts11, Ts12, Ts13, Ts14 are applied to the applicable associated semiconductor switches T11, T12, T13, T14 for the purpose of changing the magnitude or direction of the first simulation current Is1. In this context, whether a level of the applicable associated gate voltage Ts11, Ts12, Ts13, Ts14 that is above the applicable midpoint voltage T11n, T12n, T13n, T14n opens or closes a corresponding semiconductor switch T11, T12, T13, T14 is predetermined as a function of the design of the semiconductor switches T11, T12, T13, T14, which is to say for example, whether on the one hand they are so-called depletion mode field-effect transistors (for example, depletion MOSFETs) or so-called enhancement mode field-effect transistors (for example, enhancement MOSFETs), or whether on the other hand the semiconductor switches are so-called p-channel field-effect transistors or n-channel field-effect transistors.

Provision is preferably made that the first, second, third, and fourth semiconductor switches T11, T12, T13, T13 of the first control element S1 are of identical design such that the last-mentioned four semiconductor switches are thus either uniformly the identical type of depletion mode field-effect transistors or uniformly the identical type of enhancement mode field-effect transistors. In like manner, provision is preferably made that the first, second, third, and fourth semiconductor switches T11, T12, T13, T13 of the first control element S1 are of identical design such that the last-mentioned four semiconductor switches are thus either uniformly the identical type of p-channel field-effect transistors or uniformly the identical type of n-channel field-effect transistors. It is especially preferred for the second control element S2 and the third control element S3 to each be constructed with the identical type of semiconductor switches as are preferably used in the first control element S1.

According to another preferred embodiment of the simulation device Hx according to the invention, provision is made that the simulation device Hx for influencing the first simulation current Is1 has, in addition to the first control element S1, a second control element S2 and a third control element S3, wherein the first control element S1 is equipped to be controlled by the first semiconductor switch control Tc1, a second control element S2 is equipped to be controlled by a second semiconductor switch control Tc2, a third control element S3 is equipped to be controlled by a third semiconductor switch control Tc3, and wherein the first semiconductor switch control Tc1 includes at least one first carrier signal generator Cg1 for providing a centered periodic first carrier signal F1, and the second semiconductor switch control Tc2 includes at least one fifth carrier signal generator Cg5 for providing a centered periodic fifth carrier signal F5, and the third semiconductor switch control Tc3 includes at least one ninth carrier signal generator Cg9 for providing a centered periodic ninth carrier signal F9, and wherein, in a time window of multiple periods of the first carrier signal F1, the first carrier signal F1, the fifth carrier signal F5, and the ninth carrier signal F9 are, firstly, each implemented as triangular signals with identical periods and, secondly, are phase-shifted relative to one another in the time window.

Surprisingly, measurements have demonstrated that the described phase shifting of the first carrier signal F1, of the fifth carrier signal F5, and of the ninth carrier signal F9 in the said time window has a beneficial effect with regard to the intended reduction or avoidance of unwanted transient currents at the first control element output Out1 and/or at the second control element output Out2 and/or at the third control element output Out3, which ultimately contributes to a more realistic simulation of, for example, the first simulation current Is1.

In an improvement of the last-mentioned embodiment of the simulation device Hx according to the invention, in the last-mentioned time window, firstly, the magnitude of the phase shift between the first carrier signal F1 and the fifth carrier signal F5 is one third of the period of the first carrier signal F1, and, secondly, the magnitude of the phase shift between the fifth carrier signal F5 and the ninth carrier signal F9 is one third of the period of the first carrier signal F1. In especially preferred fashion, provision is made in the last-mentioned improvement that with regard to the phase shift, the first carrier signal F1 is first followed by the fifth carrier signal F5 and thereafter is followed by the ninth carrier signal F9, and that the period of the first carrier signal F1 is equal to the period of the fifth carrier signal F5 and is equal to the period of the ninth carrier signal F9, hence for the relevant period TFn where n=the number of the relevant carrier signal, the following applies: TF1=TF5=TF9.

Figure 8:
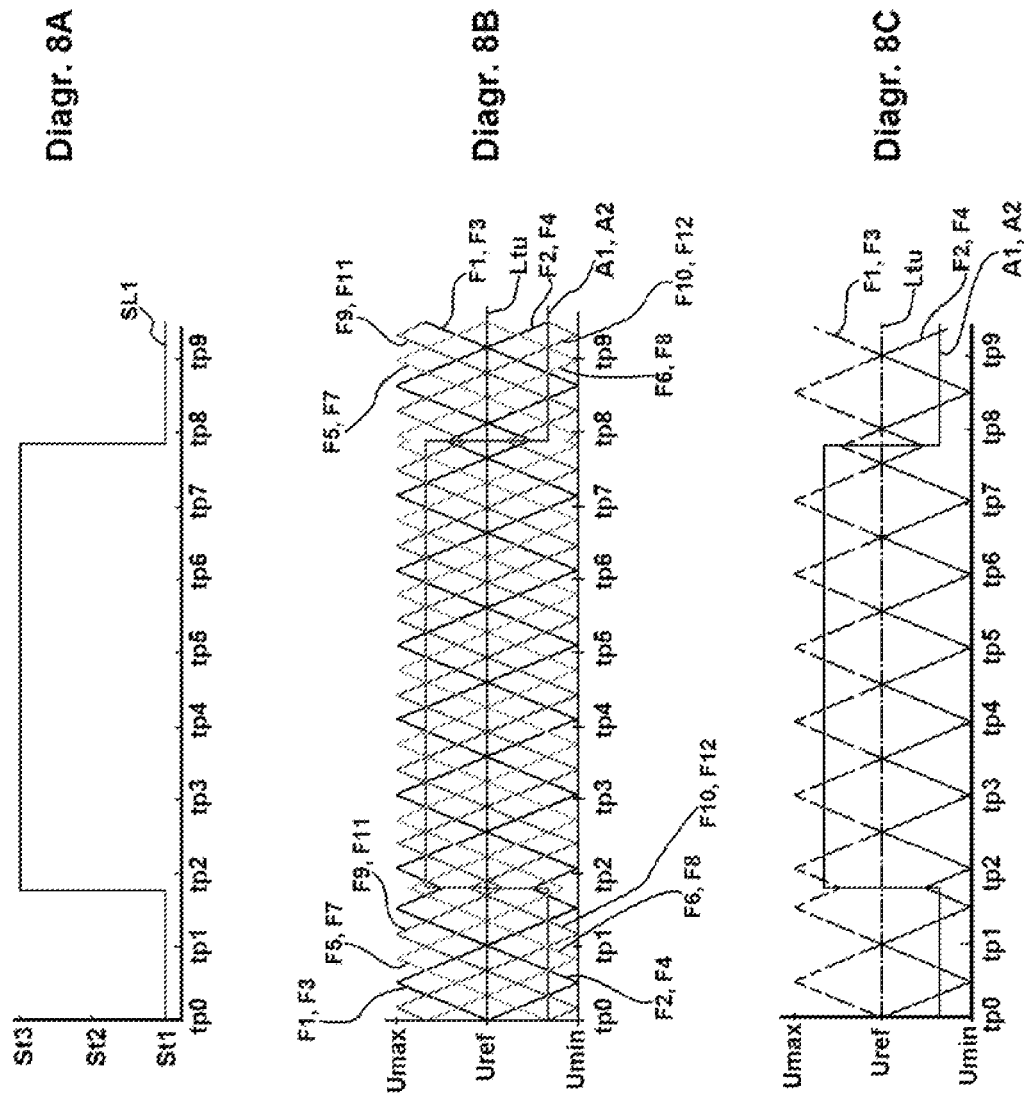
FIG. 8 is a schematic representation of example time behaviors of selected signals, voltages, and their interactions, especially at times when a state change of the control device takes place, wherein the diagram 8B of FIG. 8 relates to embodiments of the invention in which a phase shift is provided between carrier signals.

An influencing of carrier signals F1, F2 to F12 at the time of a state change of the control device DUT can be explained descriptively using the three schematic diagrams 8A to 8C in FIG. 8, which show signal behaviors over time by way of example. The representation of the time functions in diagrams 8A, 8B, and 8C show identical abscissa axes with equidistant time steps beginning at the time tp0 and ending at the time tp9. In terms of content, diagram 8A of FIG. 8 is identical to diagram 7A of FIG. 7, but is placed in FIG. 8 again in order to better clarify a time relationship of the state change shown in diagram 8A and a corresponding influencing of the carrier signals shown in diagram 8B. Diagram 8C, which contains the same information as diagram 7B, contains a subset of the information from diagram 8B.

FIG. 8 illustrates another preferred embodiment of the simulation device Hx according to the invention, wherein a period of equal length is provided in a time window of multiple periods of the first carrier signal F1 for all carrier signals shown in FIG. 8, namely carrier signals F1, F2, F3, F4, F5, F6, F7, F8, F9, F10, F11, F12, and the phase shift between the first carrier signal F1 and the fifth carrier signal F5 in the positive time direction is one third of the period of the first carrier signal F1, and the phase shift between the fifth carrier signal F5 and the ninth carrier signal F9 in the positive time direction is one third of the period of the first carrier signal F1. Here, the following applies in the last-mentioned time window: the first carrier signal F1 equals the third carrier signal F3, and the fifth carrier signal F5 equals the seventh carrier signal F7, and the ninth carrier signal F9 equals the eleventh carrier signal F11, and the carrier signals with the reference symbols F1, F3, F5, F7, F9, F11 oscillate between the common reference voltage Uref, which represents the voltage minimum of the carrier signals with the reference symbols F1, F3, F5, F7, F9, F11, and the maximum voltage Umax, which represents the voltage maximum of the carrier signals with the reference symbols F1, F3, F5, F7, F9, F11.

In the last-mentioned time window the phase shift between the second carrier signal F2 and the sixth carrier signal F6 in the positive time direction is one third of the period of the first carrier signal F1, and the phase shift between the sixth carrier signal F6 and the tenth carrier signal F10 in the positive time direction is one third of the period of the first carrier signal F1, and the second carrier signal F2 equals the fourth carrier signal F4, and the sixth carrier signal F6 equals the eighth carrier signal F8, and the tenth carrier signal F10 equals the twelfth carrier signal F12, and the carrier signals with the reference symbols F2, F4, F6, F8, F10, F12 oscillate between the common reference voltage Uref, which represents the voltage maximum of the carrier signals with the reference symbols F2, F4, F6, F8, F10, F12, and the minimum voltage Umin, which represents the voltage minimum of the carrier signals with the reference symbols F2, F4, F6, F8, F10, F12.

In accordance with the preferred embodiment of the simulation device Hx according to the invention illustrated by means of diagram 8B of FIG. 8, the following are expressed graphically in the last-mentioned time window: through mirroring of identical function curves of the first carrier signal F1 and of the third carrier signal F3 at the time axis Ltu, mirror-image identical function curves of the second carrier signal F2 and of the fourth carrier signal F4 are formed, and through mirroring of identical function curves of the fifth carrier signal F5 and of the seventh carrier signal F7 at the time axis Ltu, mirror-image identical function curves of the sixth carrier signal F6 and of the eighth carrier signal F8 are formed, and through mirroring of identical function curves of the ninth carrier signal F9 and of the eleventh carrier signal F11 at the time axis Ltu, mirror-image identical function curves of the tenth carrier signal F10 and of the twelfth carrier signal F12 are formed.

In another preferred embodiment of the simulation device Hx according to the invention, the first carrier signal generator Cg1, the fifth carrier signal generator Cg5, and the ninth carrier signal generator Cg9 are provided and equipped, at a state change time when a change from the second DUT operational state to the first DUT operational state or an opposite change takes place, to perform a sign change of the slope of the first carrier signal F1 by means of the first carrier signal generator Cg1, and to perform a sign change of the slope of the fifth carrier signal F5 by means of the fifth carrier signal generator Cg5, and to perform a sign change of the slope of the ninth carrier signal F9 by means of the ninth carrier signal generator Cg9.

A state change time is a time when a change in current direction of the first simulation current Is1 occurs, for example.

If an implementation of the invention is provided that includes up to twelve carrier signals with the reference symbols F1, F2, F3, F4, F5, F6, F7, F8, F9, F10, F11, F12 in the manner described above, then it is preferred that, at a state change time when a change from the second DUT operational state to the first DUT operational state or an opposite change takes place, all carrier signals included in the implementation perform an appropriate sign change of the slope of the corresponding carrier signal with the reference symbol F1, F2, F3, F4, F5, F6, F7, F8, F9, F10, F11, F12 by means of the corresponding carrier signal generator with the reference symbol Cg1, Cg2, Cg3, Cg4, Cg5, Cg6, Cg7, Cg8, Cg9, Cg10, Cg11, Cg12.

Practical experiments carried out by the patent applicant have demonstrated that an unwanted ripple current superimposed on the first simulation current Is1, which, for example, in many applications time-varying current superimposes certain harmonics on the first simulation current Is1, can advantageously be reduced by means of the invention or one of its described implementations. As a general rule, the ripple currents in the multistage converters described here can occur in a comparatively greater or lesser form as a function of the possible different control methods of said converters. The present teaching, in particular the paragraphs of the present description relating to diagram 7B and to diagram 8B, shows ways to reduce, using comparatively simple means or method steps, in particular the ripple currents caused by transitions at the first multistage converter of the first control element S1 and/or by transitions at the second multistage converter of the second control element S2 and/or by transitions at the third multistage converter of the third control element S3.

An advantageous improvement of the last-mentioned preferred embodiment, which relates in particular to any one of claim 12 or 13, is distinguished by the following additional features in a combination including: a first winding current Iw1 can be passed from a first converter output M1 associated with the first control element S1 to a first inductive component L1, and a second winding current Iw2 can be passed from a second converter output M2 associated with the second control element S2 to a second inductive component L2, and a third winding current Iw3 can be passed from a third converter output M3 associated with the third control element S3 to a third inductive component L3, and the first inductive component L1 has a first ferromagnetic core Fe1 for providing a magnetic coupling of the magnetic fields of the first winding current Iw1 and the third winding current Iw3, and the second inductive component L2 has a second ferromagnetic core Fe2 for providing a magnetic coupling of the magnetic fields of the first winding current Iw1 and the second winding current Iw2, and the third inductive component L3 has a third ferromagnetic core Fe3 for providing a magnetic coupling of the magnetic fields of the second winding current Iw2 and the third winding current Iw3.

In the last-mentioned improvement, preferably the windings that are arranged in pairs on an applicable ferromagnetic core Fe1, Fe2, Fe3 are arranged such that mutually corresponding DC components of the magnetic fluxes of a winding pair on the associated ferromagnetic core cancel one another out to the greatest extent possible. The windings shown in FIG. 9, which are arranged in pairs at an associated ferromagnetic core in each case, preferably contribute to reducing the effective transient inductances with regard to the ripple currents that are superimposed on the first winding current Iw1 and the second winding current Iw2 and the third winding current Iw3. This makes it possible to achieve comparatively higher dynamics in the simulation device Hx according to the invention, for example a comparatively faster change in magnitude or direction of the first simulation current Is1, which is tantamount to a further advantage in highly dynamic simulation scenarios.

Figure 9:
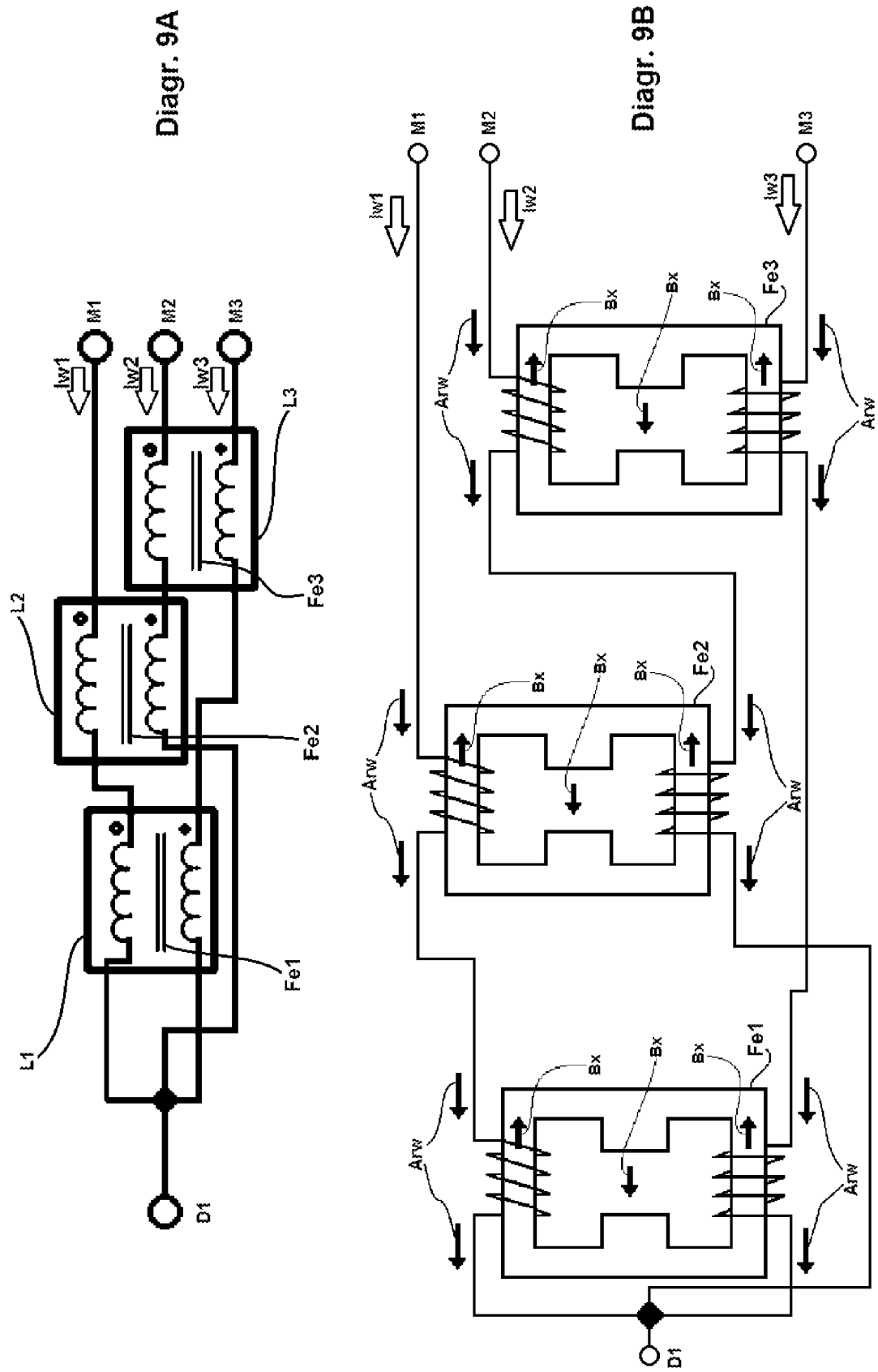
FIG. 9 is a preferred and schematically represented embodiment of a circuit arrangement for magnetic coupling of certain winding currents, wherein the circuit arrangement for magnetic coupling preferably is designed as a part of an improvement of the simulation device according to the invention.

FIG. 9 shows the same circuit arrangement in a more schematic representation in diagram 9A and in a comparatively more detailed representation in diagram 9B. Diagram 9B shows a snapshot in which the magnetic flux density flows in the direction of the arrow labeled Bx at the time shown, and the technical current direction has a direction as indicated by the arrows labeled Arw at the time shown.

Figure 10:
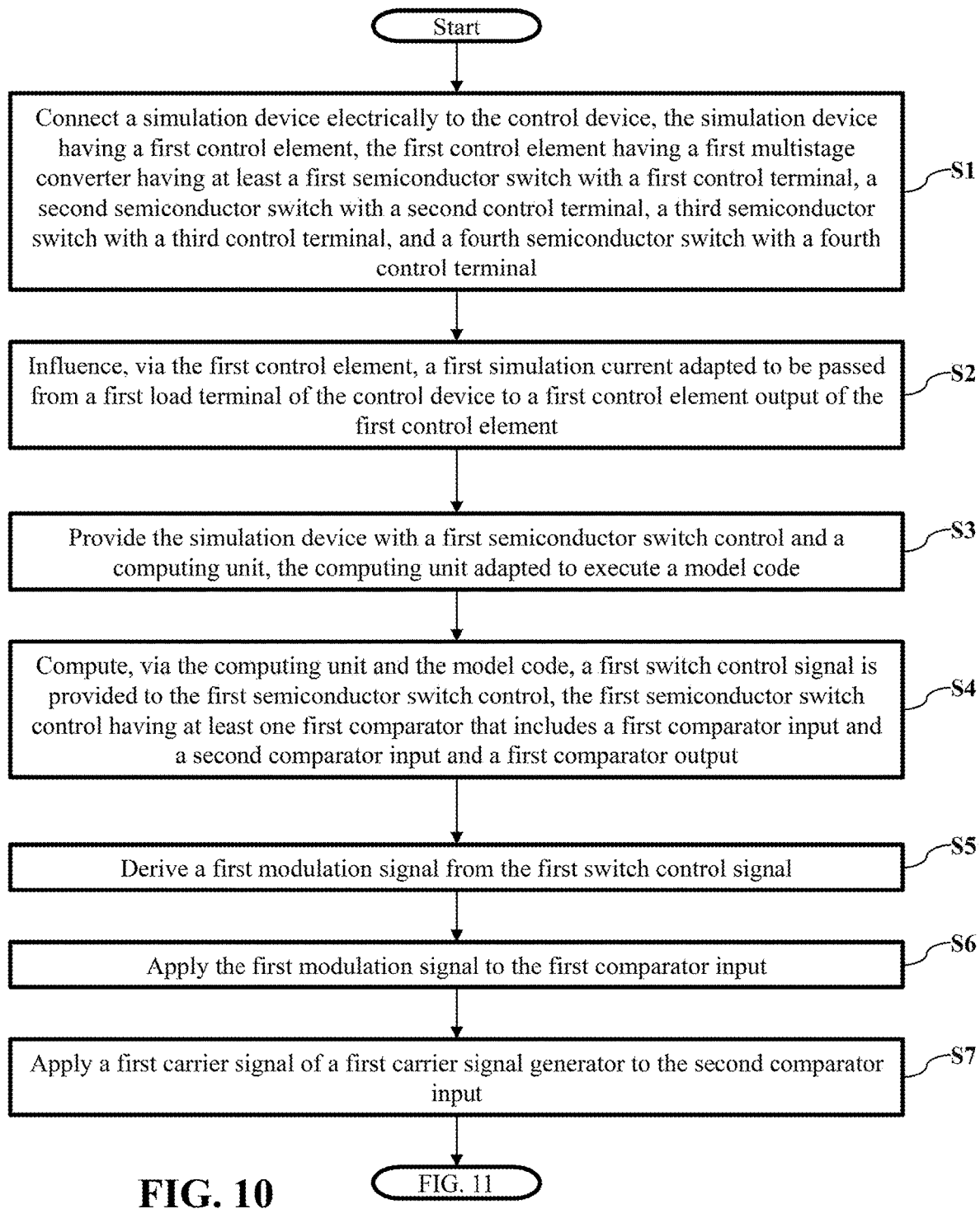
FIGS. 10 and 11 illustrate a flow chart according to an exemplary embodiment.
Figure 11:
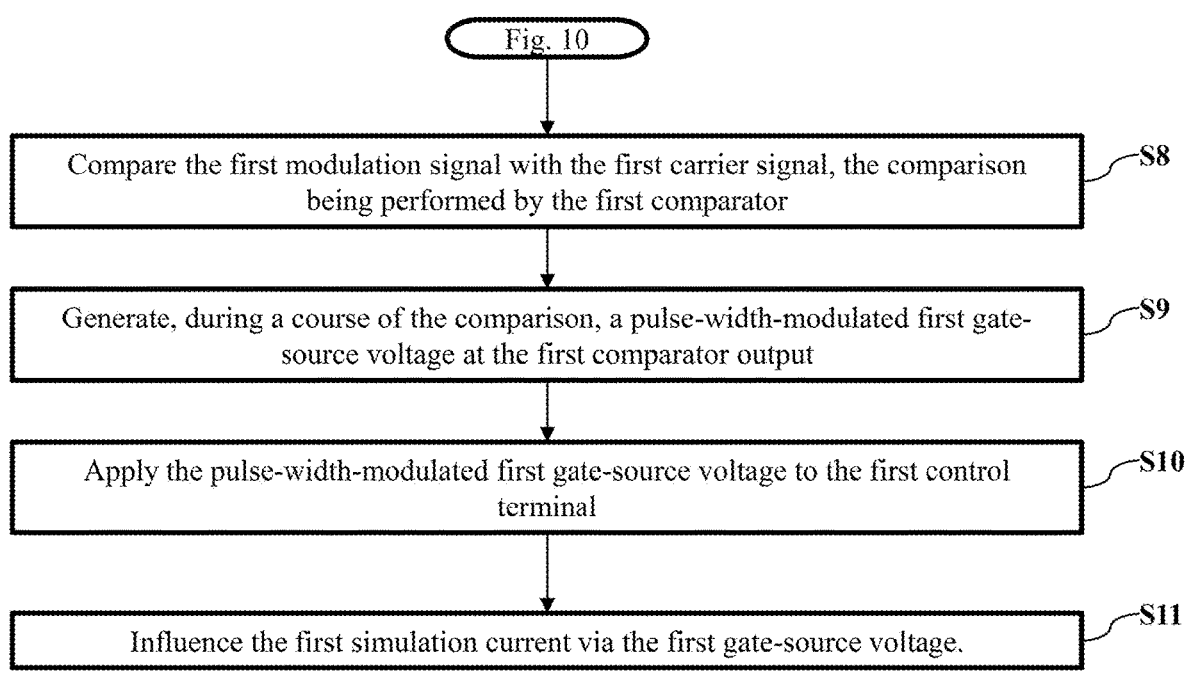

FIGS. 10 and 11 illustrate in steps S1 to S11 an exemplary embodiment of the invention.

In a preferred use of the simulation device Hx according to the invention, the device is employed as a so-called "hardware-in-the-loop simulation device," also referred to by technical experts as an HIL simulator. The computation of the model variables by means of the model code preferably takes place in real time in this case.

In summary, the advantages of the invention and its embodiments, improvements, implementations, use, etc., are that simulation results can be provided that are improved over those that are possible without the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for simulating a peripheral circuit arrangement connectable to a control device, the method comprising:
   connecting a simulation device electrically to the control device, the simulation device having a first control element, the first control element having a first multistage converter having at least a first semiconductor switch with a first control terminal, a second semiconductor switch with a second control terminal, a third semiconductor switch with a third control terminal, and a fourth semiconductor switch with a fourth control terminal;
   influencing, via the first control element, a first simulation current adapted to be passed from a first load terminal of the control device to a first control element output of the first control element;
   providing the simulation device with a first semiconductor switch control and a computing unit, the computing unit adapted to execute a model code;
   computing, via the computing unit and the model code, a first switch control signal provided to the first semiconductor switch control, the first semiconductor switch control having at least one first comparator that includes a first comparator input and a second comparator input and a first comparator output;
   deriving a first modulation signal from the first switch control signal;
   applying the first modulation signal to the first comparator input;
   applying a first carrier signal of a first carrier signal generator to the second comparator input;
   comparing the first modulation signal with the first carrier signal, the comparison being performed by the at least one first comparator;
   generating, during a course of the comparison, a pulse-width-modulated first gate-source voltage at the first comparator output;
   applying the pulse-width-modulated first gate-source voltage to the first control terminal; and
   influencing the first simulation current via the pulse-width-modulated first gate-source voltage.

2. The method according to claim 1, wherein the first semiconductor switch control has at least one second comparator, and the at least one second comparator includes a third comparator input and a fourth comparator input and a second comparator output, wherein a second modulation signal is derived from the first switch control signal and is applied to the third comparator input, and wherein a second carrier signal of a second carrier signal generator is applied to the fourth comparator input, wherein a comparison of the second modulation signal with the second carrier signal is carried out by the at least one second comparator, wherein a pulse-width-modulated second gate-source voltage is generated at the second comparator output and applied to the second control terminal, and wherein the first simulation current is influenced by the pulse-width-modulated second gate-source voltage.

3. The method according to claim 2, wherein the first carrier signal and/or the second carrier signal have a triangular waveform or a sawtooth waveform.

4. The method according to claim 2, wherein the first carrier signal generator and/or the second carrier signal generator is included in the first semiconductor switch control.

5. The method according to claim 1, wherein, in a first operational state of the control device, a first driver transistor of the control device is switched to the conducting state, wherein, in a second operational state of the control device, a second driver transistor of the control device is switched to the conducting state, wherein a change from the first operational state to the second operational state and/or a change from the second operational state to the first operational state is associated with a transmission of a first inversion signal, and wherein the transmission of the first inversion signal influences the first carrier signal and/or a second carrier signal.

6. The method according to claim 5, wherein the transmission of the first inversion signal is electronically triggered by:
   i. a voltage measurement circuit that is equipped to measure a first output voltage at the first control element output, or
   ii. a current measurement circuit that is equipped to measure the first simulation current, or
   iii. a general data interface of the control device, or
   iv. a debug interface of the control device.

7. The method according to claim 5, wherein, during the course of an identification of the first inversion signal, triggering occurs to cause the first carrier signal generator to change the first carrier signal with regard to a time axis such that:
   in a first constellation, in which a falling carrier signal edge is present at a first time of an identification of the first inversion signal, an immediate switchover to a rising carrier signal edge is executed, and/or
   in a second constellation, in which a rising carrier signal edge is present at a second time of an identification of the first inversion signal, an immediate switchover to a falling carrier signal edge is executed.

8. The method according to claim 2, wherein an effect is achieved that, in a time window of multiple periods of the first carrier signal, the first modulation signal is equal to the second modulation signal and, within the time window, the first carrier signal and the second carrier signal have voltage versus time curves that are identical in terms of magnitude and local voltage minima of the first carrier signal occur simultaneously with local voltage maxima of the second carrier signal and local voltage maxima of the first carrier signal occur simultaneously with the local voltage minima of the second carrier signal.

9. The method according to claim 1, wherein the simulation device comprises:
   a second control element including a second multistage converter and a second control element output;
   a third control element including a third multistage converter and a third control element output;
   a second semiconductor switch control including at least one fifth comparator, the fifth comparator including a ninth comparator input and a tenth comparator input and a fifth comparator output; and
   a third semiconductor switch control including at least one ninth comparator, the ninth comparator having a seventeenth comparator input and an eighteenth comparator input and a ninth comparator output,
   wherein the tenth comparator input is adapted have applied to it a fifth carrier signal of a fifth carrier signal generator, wherein the eighteenth comparator input is adapted to have applied to it a ninth carrier signal of a ninth carrier signal generator, wherein the first carrier signal, the fifth carrier signal, and the ninth carrier signal have an identical carrier signal frequency, and a first time difference from a signal maximum of the first carrier signal to a chronologically sequential signal maximum of the fifth carrier signal is equal to a second time difference from the signal maximum of the fifth carrier signal to a chronologically sequential signal maximum of the ninth carrier signal, and wherein the first control element output and the second control element output and the third control element output are electrically connected to one another.

10. A simulation device for simulating a peripheral circuit arrangement, the simulation device being adapted to be electrically connected to a control device, the simulation device comprising:

a first control element with which a first simulation current is provided from a first load terminal of the control device to a first control element output of the first control element is influenced, the first control element including a first multistage converter having at least a first semiconductor switch with a first control terminal, a second semiconductor switch with a second control terminal, a third semiconductor switch with a third control terminal, and a fourth semiconductor switch with a fourth control terminal;

a first semiconductor switch control; and a computing unit adapted to execute a model code, wherein, via the computing unit and the model code, a first switch control signal is computed and provided to the first semiconductor switch control, wherein the first semiconductor switch control has at least one first comparator, and the at least one first comparator includes a first comparator input and a second comparator input and a first comparator output, the first comparator input being adapted to have a first modulation signal applied thereto, the first modulation signal being derived from the first switch control signal, and the second comparator input being adapted to have a first carrier signal of a first carrier signal generator being applied thereto, wherein a comparison of the first modulation signal with the first carrier signal is carried out by the at least one first comparator, wherein, during a course of the comparison, a pulse-width-modulated first gate-source voltage is generated at the first comparator output, wherein the pulse-width-modulated first gate-source voltage is applied to the first control terminal, and wherein the first simulation current is influenced by the pulse-width-modulated first gate-source voltage.

11. The simulation device according to claim 10, wherein the simulation device performs a method:

connecting the simulation device electrically to the control device, the first control element having a first multistage converter having at least a first semiconductor switch with the first control terminal, a second semiconductor switch with a second control terminal, a third semiconductor switch with a third control terminal, and a fourth semiconductor switch with a fourth control terminal;

influencing, via the first control element, the first simulation current adapted to be passed from a first load terminal of the control device to a first control element output of the first control element;

providing the simulation device with the first semiconductor switch control and the computing unit, the computing unit adapted to execute the model code;

computing, via the computing unit and the model code, the first switch control signal being provided to the first semiconductor switch control, the first semiconductor switch control having the at least one first comparator that includes the first comparator input and the second comparator input and the first comparator output;

deriving the first modulation signal from the first switch control signal;

applying the first modulation signal to the first comparator input;

applying the first carrier signal of the first carrier signal generator to the second comparator input;

comparing the first modulation signal with the first carrier signal, the comparison being performed by the first comparator;

generating the pulse-width-modulated first gate-source voltage at the first comparator output;

applying the pulse-width-modulated first gate-source voltage to the first control terminal; and influencing the first simulation current via the pulse-width-modulated first gate-source voltage.

12. The simulation device according to claim 10, wherein the simulation device has a second control element and a third control element for influencing the first simulation current, wherein the first control element is adapted to be controlled by the first semiconductor switch control, wherein a second control element is adapted to be controlled by a second semiconductor switch control, wherein a third control element is adapted to be controlled by a third semiconductor switch control, wherein the first semiconductor switch control includes at least one first carrier signal generator for providing a centered periodic first carrier signal, wherein the second semiconductor switch control includes at least one fifth carrier signal generator for providing a centered periodic fifth carrier signal, wherein the third semiconductor switch control includes at least one ninth carrier signal generator for providing a centered periodic ninth carrier signal, and wherein, in a time window of multiple periods the first carrier signal, the fifth carrier signal, and the ninth carrier signal are triangular signals with identical periods and are phase-shifted relative to one another in the time window.

13. The simulation device according to claim 12, wherein, a magnitude of a phase shift between the first carrier signal and the fifth carrier signal is one third of a period of the first carrier signal, and wherein a magnitude of a phase shift between the fifth carrier signal and the ninth carrier signal is one third of the period of the first carrier signal.

14. The simulation device according to claim 12, wherein the first carrier signal generator, the fifth carrier signal generator, and the ninth carrier signal generator are adapted, at a state change time when a change from a second operational state to a first operational state or a change from the first operational state to the second operational state takes place, to perform a sign change of the slope of the first carrier signal via the first carrier signal generator and to perform a sign change of the slope of the fifth carrier signal via the fifth carrier signal generator and to perform a sign change of the slope of the ninth carrier signal via the ninth carrier signal generator.

15. The simulation device according to claim 12, wherein a first winding current is passed from a first converter output associated with the first control element to a first inductive component, wherein a second winding current is passed from a second converter output associated with the second control element to a second inductive component, wherein a third winding current is passed from a third converter output associated with the third control element to a third inductive component, wherein the first inductive component has a first ferromagnetic core for providing a magnetic coupling of the magnetic fields of the first winding current and the third winding current, wherein the second inductive component has a second ferromagnetic core for providing a magnetic coupling of the magnetic fields of the first winding current and the second winding current, and wherein the third inductive component has a third ferromagnetic core for providing a magnetic coupling of the magnetic fields of the second winding current and the third winding current.

\* \* \* \* \*